(12) United States Patent
Li et al.

(10) Patent No.: US 8,525,954 B2
(45) Date of Patent: Sep. 3, 2013

(54) THREE-DIMENSIONAL DISPLAY ARTICLE

(75) Inventors: Yun Li, Niskayuna, NY (US); Jie Liu, Niskayuna, NY (US); Gautam Parthasarathy, Saratoga Springs, NY (US); Anping Zhang, Rexford, NY (US); Gelu Comanescu, Alexandria, VA (US)

(73) Assignee: General Electric Company, Niskyuna, NY (US)

( * ) Notice: Subject to any disclaimer, the term of this patent is extended or adjusted under 35 U.S.C. 154(b) by 1833 days.

(21) Appl. No.: 11/768,937

(22) Filed: Jun. 27, 2007

(65) Prior Publication Data

US 2009/0002266 A1    Jan. 1, 2009

(51) Int. Cl.
*G02F 1/1347*    (2006.01)

(52) U.S. Cl.
USPC .......................................................... 349/74

(58) Field of Classification Search
USPC .......................................................... 349/74
See application file for complete search history.

(56) References Cited

U.S. PATENT DOCUMENTS

| | | | |
|---|---|---|---|
| 5,745,197 A * | 4/1998 | Leung et al. ............... | 349/77 |
| 5,919,551 A | 7/1999 | Cobb, Jr. et al. | |
| 6,322,236 B1 | 11/2001 | Campbell et al. | |
| 6,755,533 B2 | 6/2004 | Fraser et al. | |
| 7,049,636 B2 | 5/2006 | Weaver et al. | |
| 7,068,418 B2 | 6/2006 | Kawase | |
| 7,317,047 B2 * | 1/2008 | Hsu ............................ | 524/165 |
| 7,579,653 B2 * | 8/2009 | Suh et al. ................... | 257/347 |
| 7,652,280 B2 * | 1/2010 | Li et al. ...................... | 257/13 |
| 7,683,303 B2 * | 3/2010 | Lincoln et al. ............ | 250/208.1 |
| 8,253,652 B2 * | 8/2012 | Koo et al. ................... | 345/6 |
| 2002/0190921 A1 | 12/2002 | Hilton | |
| 2003/0168964 A1 | 9/2003 | Chen | |
| 2004/0017678 A1 | 1/2004 | Liu | |
| 2004/0086123 A1 | 5/2004 | Neves et al. | |
| 2004/0246199 A1 | 12/2004 | Ramian | |
| 2006/0051994 A1 | 3/2006 | Fujii | |

(Continued)

OTHER PUBLICATIONS

Cao et al., "Highly Bendable, Transparent Thin-Film Transistors That Use Carbon-Nanotube-Based Conductors and Semiconductors With Elastomeric Dielectrics", Advanced Materials, Communications, vol. 18, pp. 305-309.

(Continued)

*Primary Examiner* — James Dudek
(74) *Attorney, Agent, or Firm* — Joseph J. Christian

(57) ABSTRACT

An article is provided in one embodiment of the invention. The article includes a display structure having a height, a width, and a thickness that define a volume. The display structure further includes components that emit light to generate a three-dimensional image within the volume. The display structure includes a stack. The stack includes at least one layer. The layer includes a substrate, the components that emit light and a controller. The components that emit light may each be secured to the substrate. The controller may be secured to the substrate. The controller may control the components that emit light to generate a three-dimensional image within the volume. The controller may be connected to two or more of the organic electronic devices. The components that emit light may include organic electronic devices. The components that emit light may include a light-emitting nanowire device. The layer may include at least one sub-layer capable of emitting red light, at least one sub-layer capable of emitting blue light, and at least one sub-layer capable of emitting green light, and at least one layer that is capable of reversibly opacifying.

33 Claims, 18 Drawing Sheets

(56) References Cited

U.S. PATENT DOCUMENTS

| | | |
|---|---|---|
| 2006/0078286 A1 | 4/2006 | Igoe et al. |
| 2006/0091823 A1 | 5/2006 | Nostwick |
| 2006/0138072 A1 | 6/2006 | Mishra |

OTHER PUBLICATIONS

Liu, "Color Tunable Light-Emitting Devices and Method of Making the Same", Pending U.S. Appl. No. 11/299,925, filed Dec. 12, 2005.

Liu, "Color Tunable Light-Emitting Devices and Method of Making the Same", Pending U.S. Appl. No. 11/301,167, filed Dec. 12, 2005.

Cao et al., "Highly Bendable, Transparent Thin-Film Transistors That Use Carbon-Nanotube-Based Conductors and Semiconductors With Elastomeric Dielectrics", Advanced Materials, Communications, vol. 18, pp. 305-309. 2006.

Liu, "Color Tunable Light-Emitting Devices and Method of Making the Same", Pending U.S. Appl. No. 11/299,925, filed on Dec. 12, 2005, GE Docket No. 166471-1.

Liu, "Color Tunable Light-Emitting Devices and Method of Making the Same", Pending U.S. Appl. No. 11/301,167, filed on Dec. 12, 2005, GE Docket No. 166471-2.

* cited by examiner

THREE-DIMENSIONAL DISPLAY ARTICLE

BACKGROUND

1. Technical Field

The invention includes embodiments that relate to an article. The invention includes embodiments that relate to an article providing a three-dimensional display and methods of making the article. Embodiments of the article may emit light.

2. Discussion of Art

A three-dimensional representation of graphics and video may be sometimes desirable. Stereovision is one method for producing a three-dimensional image, but only takes into account binocular disparity (static parallax). Computer software driven methods for producing a three-dimensional image and animation may give the impression of three-dimensional information by shifting and/or rotating motion. Current computer software methods may require undesirably large amounts of computing power, and may not product a satisfactory image.

Conventional holography is three-dimensional imaging method having actual image depth. But conventional holography creates an image that is static, and has some other drawbacks. Other drawbacks include a ghost effect allowing a viewer to see through the nearest image surface to the farthest image surface at the same time.

Vibrating screen displays, oscillating screen displays, and rotating screen displays belong to another class of imaging displays. Each may define a volume three-dimensional image by lateral or rotational volume-sweeping of a two-dimensional illuminated screen or disk. A cumbersome opto-mechanical projection system accompanies the equipment.

A split image display refers to a method of three-dimensional imaging using an illusion of depth created by projecting to the viewer's eyes two pseudoscopic images of two different focal lengths—a foreground image and a background image. The image projection may be by Fresnel lenses. The two different focal contents force the viewer to constantly refocus his eyes, thereby creating an eye accommodation and convergence effect. Static and motion parallax also exist with this method. The method does not utilize any mechanical volume sweeping. There is limited detailed depth information available from specific objects. For example, an object in the foreground will have a two-dimensional appearance, even though the overall image creates a three-dimensional illusion.

For interior/exterior decorations and signage, it may be desirable to obtain a desired three-dimensional output. It may be desirable to have an article with differing characteristics or properties than those articles that are currently available.

BRIEF DESCRIPTION

An article is provided in one embodiment of the invention. The article includes a display structure having a height, a width, and a thickness that define a volume. The display structure further includes components that emit light to generate a three-dimensional image within the volume. The display structure includes a stack. The stack includes at least one layer. The layer includes a substrate, the components that emit light and a controller. The components that emit light may each be secured to the substrate. The controller may be secured to the substrate. The controller may control the components that emit light to generate a three-dimensional image within the volume. The components that emit light may include organic electronic devices. The controller may be connected to two or more of the organic electronic devices. The components that emit light may include a light-emitting nano-wire device.

An article is provided in one embodiment of the invention. The article includes a display structure having a height, a width, and a thickness that define a volume. The display structure further includes components that emit light to generate a three-dimensional image within the volume. The display structure includes a stack. The stack includes at least one layer. The layer includes a substrate, the components that emit light and a controller. The components that emit light may each be secured to the substrate. The controller may be secured to the substrate. The controller may control the components that emit light to generate a three-dimensional image within the volume. The layer includes at least one sub-layer capable of emitting red light, at least one sub-layer capable of emitting blue light, and at least one sub-layer capable of emitting green light, and at least one layer that is capable of reversibly opacifying.

In one embodiment, is provided a method of forming an image. The method includes controlling organic electronic devices in a volume that are spaced vertically and horizontally relative to a viewer to form a three-dimensional image, and switching on/off light-emitting nano-wires.

In one embodiment, is provided a method of forming an image. The method includes controlling organic electronic devices that are in a volume and spaced vertically and horizontally relative to a viewer to form a three-dimensional image, and switching on/off the organic electronic devices using transparent controllers. The controllers may each be attached to a plurality of light-emitting devices.

In one embodiment, is provided a method. The method includes forming in a volume a complete three-dimensional image observable by a viewer. The method further includes forming an opaque layer that transects the image.

BRIEF DESCRIPTION OF THE DRAWINGS

Like numbers represent like parts throughout the drawings, wherein.

DETAILED DESCRIPTION

Figure 1:
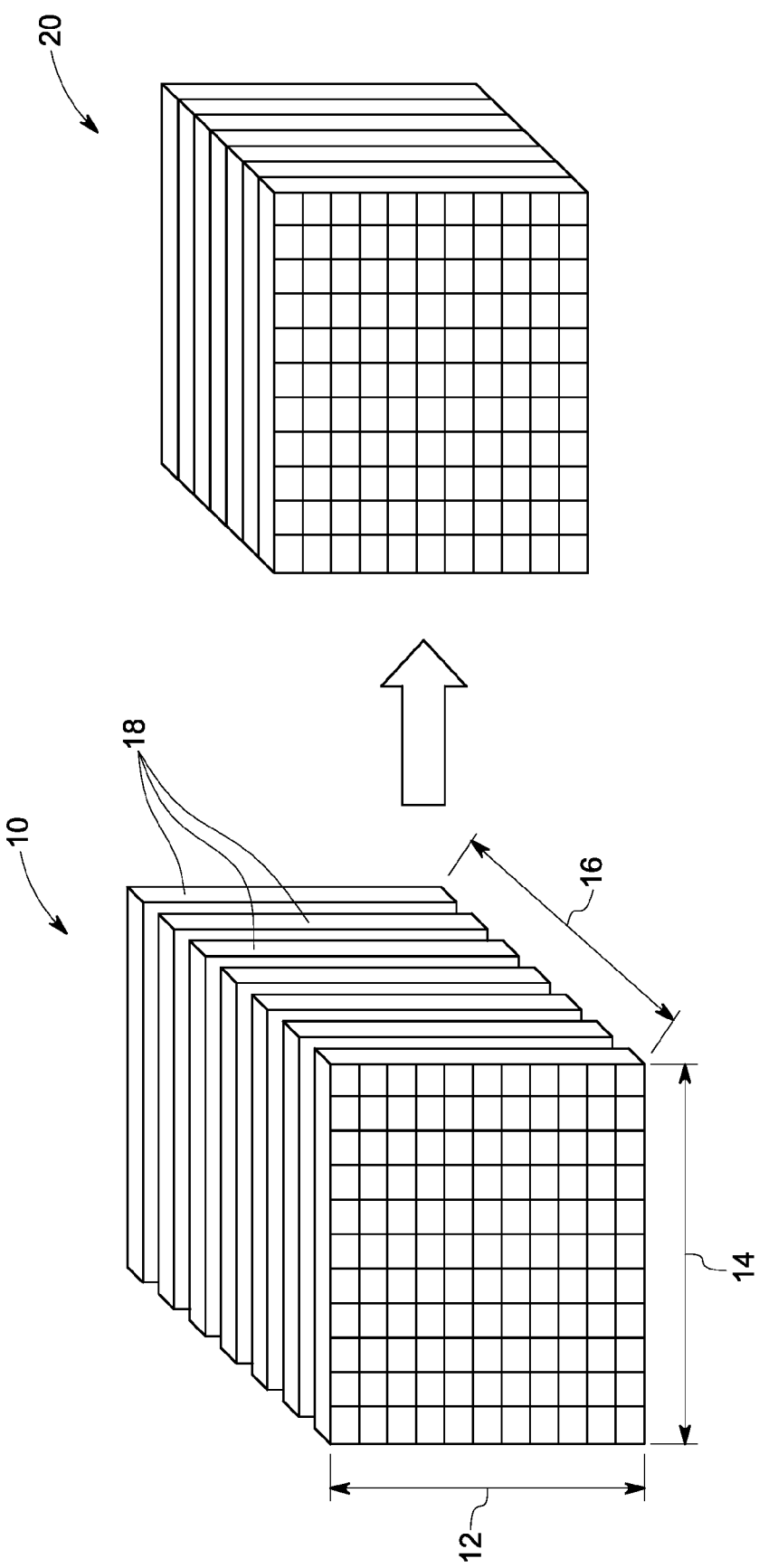
FIG. 1 is a schematic representation of an embodiment of an article according to the invention.

The invention includes embodiments that relate to an article. The invention includes embodiments that relate to an article providing a three-dimensional display and methods of making the article. Embodiments of the article may emit light.

Approximating language, as used herein throughout the specification and claims, may be applied to modify any quantitative representation that could permissibly vary without resulting in a change in the basic function to which it is related. Accordingly, a value modified by a term or terms, such as "about" is not limited to the precise value specified. In some instances, the approximating language may correspond to the precision of an instrument for measuring the value. Similarly, "free" may be used in combination with a term, and may include an insubstantial number, or trace amounts, while still being considered free of the modified term. The singular forms "a", "an" and "the" include plural referents unless the context clearly dictates otherwise.

As used herein, the term "secured to" or "disposed over" or "deposited over" or "disposed between" refers to both secured or disposed directly in contact with and indirectly by having intervening layers therebetween. "Operably coupled" is a relationship between listed parts that provides a stated function. Without further qualifiers, "light transmissive" means that greater than about 50 percent of light of at least one frequency in the visible wavelength range transmits through a material of a given thickness. The visible wavelength range is about 400 nanometers to about 700 nanometers. Some materials transmit more or less light based on the wavelength of the light. That is, a material that is light transmissive at one frequency may be more or less transmissive at another wavelength.

The term "nano-wire" refers to a wire having one or more dimensions of the order of a few nanometers. The term "light-emitting nano-wire device" refers to a light-emitting device including one or more nano-wires and the nano-wires emit light. The term "three-dimensional image" refers to an image of an object, and the image has properties that allow a viewer to visualize the length, width and height of the object. The length, width and height are the three dimensions required to describe the position and relevant characteristics of any object within a conceptual space, such as for example an optical device capable of providing the feeling of three dimensions; the optical device makes a displayed object have an observable depth.

One embodiment provides an article capable of showing an image of an object in a manner that renders the image three-dimensional. The article includes a display structure having a height, a width, and a thickness that define a volume. The display structure further includes components that emit light to generate a three-dimensional image within the volume. The display structure includes a stack. The stack includes at least one layer. The layer includes a substrate. The components that emit light may be secured to the substrate. A controller may be secured to the substrate. The controller may control the components that emit light to generate a three-dimensional image within the volume. In one embodiment, the components that emit light may be organic electronic devices. The controller may be connected to two or more of the organic electronic devices. In one embodiment, the components that emit light may include a light-emitting nano-wire device.

The components that emit light may be formed from a light transmissive material. The light transmissive material can be clear in one embodiment. In another embodiment, the light transmissive material can have a color, tint, or optical effect inducing quality (such as opalescence or polarization). In one embodiment, without regard for wavelength or thickness, the amount of light transmitted through the components that emit light is in a range of from about 60 percent to about 70 percent, from about 70 percent to about 80 percent, or from about 80 percent to about 90 percent of the light. In one embodiment, without regard for percent transmission or thickness, the transmitted light may have a wavelength in a range of from about 400 nanometers to about 500 nanometers, from about 500 nanometers to about 600 nanometers, or from about 600 nanometers to about 700 nanometers. In one embodiment, more than about 50 percent of the light at wavelength of about 550 nanometers is transmitted through the components that emit light without regard for the thickness. The above-discussed embodiments on the amount and the wavelength of transmitted light hold true for the substrate, the controller, the organic electronic light-emitting devices, the resultant device and the article made therefrom. Thickness of various embodiments are disclosed hereinbelow.

The substrate may be chosen from a group of rigid substrates and flexible substrates. The rigid substrates include but are not limited to glass, metal and plastic; and the flexible substrates include flexible glass, metal foil, and plastic films. Non-limiting examples of glass may include quartz glass and borosilicate glass. Non-limiting examples of plastic may include organic polymers. Suitable organic polymers may include thermoplastic polymers chosen from polyethylene terephthalate, polyethylene naphthalate, polyethersulfone, polycarbonate, polyimide, polyacrylate, polyolefin, and the like. The substrate forms a part of the device and may also be a separate substrate layer relative to the organic electronic devices. In one embodiment, the substrate is light transmissive.

In one embodiment, the components that emit light are organic electronic light-emitting devices OLEDs, and the controller is connected to two or more of the organic electronic light-emitting devices. In one embodiment, the OLED includes a first electrode anode and a second electrode cathode. An electroluminiscent layer is disposed between the first electrode and the second electrode. The first electrode and second electrode are operably coupled to at least one tunable voltage source. In one embodiment the organic electronic device is light transmissive.

Suitable anodes may include a material having a high work function; e.g., greater than about 4.0 electron volts. In one embodiment, the anode material work function may be in a range of from about 5 electron volts to about 6 electron volts, or from about 6 electron volts to about 7 electron volts. Transparent metal oxides may be used as the anode. Transparent metal oxide is light transmissive and allows light emitted from the organic emissive layer to escape through the transparent metal oxide anode without being seriously attenuated. Suitable materials for use as the anode may include indium tin oxide. Other materials suitable for use as the anode are tin oxide, indium oxide, zinc oxide, indium zinc oxide, zinc indium tin oxide, antimony oxide, and the like. The anode thickness may be greater than about 10 nanometers. In one embodiment, the thickness may be in the range of from about 10 nanometers to about 50 nanometers, from about 50 nanometers to about 100 nanometers, or from about 100 nanometers to about 200 nanometers.

In one embodiment, a thin transparent layer of a metal is suitable for the anode. A transparent metal layer may have a thickness of less than or equal to about 50 nanometers. In one embodiment, the metal thickness may be in a range of from about 50 nanometers to about 20 nanometers. Suitable metals for the anode may include, for example, silver, copper, tungsten, nickel, cobalt, iron, selenium, germanium, gold, platinum, aluminum, or mixtures thereof or alloys thereof. The anode may be deposited on the underlying element by a technique such as physical vapor deposition, chemical vapor deposition, or sputtering.

The cathode injects negative charge carriers electrons into the organic emissive layer and may be made of a material having a low work function; for example, less than about 4 electron volts. Not every material suitable for use as the cathode need have a low work function. Materials suitable for use as the cathode may include K, Li, Na, Mg, Ca, Sr, Ba, Al, Ag, In, Sn, Zn, Zr, Sc, and Y. Other suitable materials may include elements of the lanthanide series, alloys thereof, or mixtures thereof. Examples of suitable alloy materials for the manufacture of cathode layer may include Ag—Mg, Al—Li, In—Mg, and Al—Ca alloys. Layered non-alloy structures may be used. Such layered non-alloy structures may include a thin layer of a metal such as Ca having a thickness in a range of from about 1 nanometer to about 50 nanometers. Other such layered non-alloy structures may include a non-metal such as LiF, KF, or NaF, over-capped by a thicker layer of some other metal. A suitable other metal may include aluminum or silver. The cathode may be deposited on the underlying layer by, for example, physical vapor deposition, chemical vapor deposition, or sputtering.

Suitable OLEDs may include an electroluminescent layer, which may be referred to as an organic emissive layer or as a light-emitting layer. Electroluminiscent (EL) materials refer to organic fluorescent and/or phosphorescent materials. Electroluminiscent materials emit light when subjected to an applied voltage bias. Electroluminescent materials may be tailored to emit light in a determined wavelength range. In one embodiment, the thickness of the electroluminiscent layer may be greater than about 40 nanometers. In one embodiment, the thickness may be less than about 300 nanometers. The electroluminiscent material may be a polymer, a copolymer, or a mixture of polymers. Suitable electroluminescent materials may include poly N-vinylcarbazole (PVK) and its derivatives; polyfluorene and its derivatives, such as poly-alkylfluorene, for example poly-9,9-dihexylfluorene, poly-dioctylfluorene, or poly-9,9-bis-3,6-dioxaheptyl-fluorene-2,7-diyl; poly para-phenylene and its derivatives, such as poly-2-decyloxy-1,4-phenylene or poly-2,5-diheptyl-1,4-phenylene; polyp-phenylene vinylene and its derivatives, such as dialkoxy-substituted PPV and cyano-substituted PPV; polythiophene and its derivatives, such as poly-3-alkylthiophene, poly-4,4'-dialkyl-2,2'-bithiophene, poly-2,5-thienylene vinylene; polypyridine vinylene and its derivatives; polyquinoxaline and its derivatives; and polyquinoline and its derivatives. In one embodiment, a suitable electroluminescent material is poly-9,9-dioctylfluorenyl-2,7-diyl end capped with N,N-bis 4-methylphenyl-4-aniline. Mixtures of these polymers or copolymers based on one or more of these polymers may be used.

Other suitable materials that may be used as electroluminescent materials are polysilanes. Polysilanes are linear polymers having a silicon-backbone substituted with an alkyl and/or aryl side groups. Polysilanes are quasi one-dimensional materials with delocalized sigma-conjugated electrons along polymer backbone chains. Examples of polysilanes include poly di-n-butylsilane, poly di-n-pentylsilane, poly di-n-hexylsilane, polymethyl phenylsilane, and poly bis p-butyl phenylsilane.

In one embodiment, organic materials having molecular weight of less than about 5000, including aromatic units, may be used as electroluminiscent materials. An example of such a material is 1,3,5-tris N-4-diphenyl amino phenyl phenyl amino benzene, which emits light in the wavelength range of from about 380 nanometers to about 500 nanometers. These electroluminiscent layer organic materials may be prepared from organic molecules such as phenylanthracene, tetraarylethene, coumarin, rubrene, tetraphenylbutadiene, anthracene, perylene, coronene, or their derivatives. These materials may emit light having a maximum wavelength of about 520 nanometers. Still other suitable materials include the low molecular-weight metal organic complexes. Such complexes may include aluminum-acetylacetonate, gallium-acetylacetonate, and indium-acetylacetonate, which emit light in the wavelength range of about 415 nanometers to about 457 nanometers. Other suitable complexes may include aluminum picolymethylketone bis-2,6-dibutylphenoxide and scandium-4-methoxy picolyl methyl ketone-bis acetyl acetonate, which emit light having a wavelength in a range of from about 420 nanometers to about 433 nanometers. Other suitable electroluminiscent materials that emit in the visible wavelength range may include organo-metallic complexes of 8-hydroxyquinoline, such as tris-8-quinolinolato aluminum and its derivatives.

The OLED may further include one or more layers such as a charge transport layer, a hole transport layer, a hole injection layer, a hole injection enhancement layer, an electron transport layer, an electron injection layer and an electron injection enhancement layer or any combinations thereof. The OLED may further include a light transmissive substrate layer.

Non-limiting examples of materials suitable for use as charge transport layers may include low-to-intermediate molecular weight organic polymers for example, organic polymers having weight average molecular weights Mw of less than about 200,000 grams per mole as determined using polystyrene standards for example, poly-3,4-ethylene dioxy thiophene (PEDOT), polyaniline, poly-3,4-propylene dioxythiophene (PProDOT), polystyrene sulfonate (PSS), polyvinyl carbazole (PVK), and other like materials.

Non-limiting examples of materials suitable for the hole transport layer may include triaryldiamines, tetraphenyldiamines, aromatic tertiary amines, hydrazone derivatives, carbazole derivatives, triazole derivatives, imidazole derivatives, oxadiazole derivatives including an amino group, polythiophenes, and like materials. Non-limiting examples of materials suitable for a hole-blocking layer may include poly N-vinyl carbazole, and like materials.

Non-limiting examples of materials suitable for a hole-injection layers may include "p-doped" proton-doped conducting polymers, such as proton-doped polythiophene or polyaniline, and p-doped organic semiconductors, such as tetrafluorotetracyanoquinodimethane (F4-TCQN), doped organic and polymeric semiconductors, and triarylamine-containing compounds and polymers. Non-limiting examples of electron-injection materials may include polyfluorene and its derivatives, aluminum tris-8-hydroxyquinoline (Alq3), organic/polymeric semiconductors n-doped with alkali alkaline earth metals, and the like.

Non-limiting examples of materials suitable for a hole injection enhancement layer may include arylene-based compounds such as 3,4,9,10-perylene tetra-carboxylic dianhydride, bis-1,2,5-thiadiazolo-p-quino bis-1,3-dithiole, and like materials.

Non-limiting examples of materials suitable for the electron injection enhancement layer materials and electron transport layer materials may include metal organic complexes such as oxadiazole derivatives, perylene derivatives, pyridine derivatives, pyrimidine derivatives, quinoline derivatives, quinoxaline derivatives, diphenylquinone derivatives, nitro-substituted fluorene derivatives, and like materials.

In one embodiment, the organic electronic device may include a color-tunable light-emitting device. The color-tunable light-emitting device may include a first light-emitting element, a second light-emitting element, an active light transformative element and/or a passive light transformative element, and at least one light transmissive element, wherein the first light-emitting element and the second light-emitting element emit light at differing wavelengths. In one embodiment, color-tunable light-emitting device may be a light transmissive device.

The first light-emitting element and the second light-emitting element may include an OLED. The OLED used may be the same as or similar to those described above. The active light transformative element may include at least one element chosen from the group of electrochromic elements, photochromic elements, and thermochromic elements. The active light transformative element may be disposed between the first light-emitting element and the second light-emitting element. In certain embodiments, a combination of the electrochromic element and/or photochromic element and/or thermochromic element may be used in color-tunable light-emitting device to modulate the light emitted from the device. When an electrochromic element is used the transmission of the electrochromic element can be varied by varying an applied bias. The perceived color of the light emerging from the device is thus a combination of the light emerging directly from the color-tunable light-emitting device and the light modulated by the electrochromic element. When a photochromic element is used, the photochromic element can be tuned by coupling with a light tunable source. When a thermochromic element is used the thermochromic element can be tuned by coupling with a temperature tunable source.

Active light transformative elements modulate light passing through them in response to and as a function of an applied bias as discussed above. Applying bias to a lesser or greater extent is tuning. Electrochromic, photochromic and thermochromic materials known in the art may be used as the active light transformative element.

Examples of suitable electrochromic elements may include inorganic metal oxides, most transition metal oxides (e.g., WO3, V2O5, and the like), electroconductive polymers, and the like. Suitable electroconductive polymers may include unsubstituted and substituted polyaniline, polythiophene and polypyrrole. Examples of suitable electrode materials for use in the electrochromic elements are transparent metal oxides, such as ITO, fluorine doped SnO2, and the like; semi-transparent thin metals such as gold; and conducting polymers, such as poly-3,4-ethylenedioxythiophene/polystyrene sulfonate (PEDOT/PSS), and like materials. In one embodiment, ion conductors and electrolytes may be employed as components of the electrochromic element in the color-tunable light-emitting device. Examples of suitable ion conductors and electrolytes include liquid electrolyte solutions, such as lithium perchlorate in propylene carbonate, and ionic liquids; gel electrolytes including a polymeric material e.g., polyvinyl butyral, polyethylene oxide, polymethyl methacrylate, and polyethylene glycol, a lithium salt, and a solvent, and solid polymeric electrolytes. Suitable lithium salts may include LiClO4, LiCF3SO3, LiCl, and LiPF6. Suitable solvents may include one or more of propylene carbonate, acetonitrile, ethylene carbonate, and the like. Suitable solid polymeric electrolytes may include cured or crosslinked polyacrylates, polyurethanes, and the like.

Suitable photochromic materials include asymmetric photochromic compounds. Pyran derivatives may be used as photochromic material in the photochromic element. Suitable pyran derivatives may include 3,4-diphenylaminophenyl-1-3-2-fluorophenyl-3H-naphtho(2,1-b)pyran; 3,4-dimethyl aminophenyl-3,2-fluorophenyl-3H-naphtho(2,1-b)pyran; 3,2-fluorophenyl-3-(4-N-morpholinylphenyl)-3H-naphtho(2,1-b)pyran; 3,2-fluorophenyl-3-(4-N-piperidinylphenyl)-3H-naphtho(2,1-b)pyran; 3-4-dimethyl aminophenyl-6-N-morpholinyl-3-phenyl-3H-naphtho(2,1-b)pyran; 6-N-morpholinyl-3-(4-N-morpholinylphenyl)-3-phenyl-3H-naphtho(2,1-b)pyran; 6-N-morpholinyl-3-phenyl-3-(4-N-piperidinyl phenyl)-3H-naphtho(2,1-b)pyran; and 6-N-morpholinyl-3-phenyl-3-(4-N-pyrrolidinylphenyl)-3H-naphtho(2,1-b)pyran; and mixtures of two or more of the foregoing. Other suitable photochromic materials may include photochromic indeno(2,1-f)naphtho(1,2-b)pyrans and spiro-9-fluoreno(1,2-b)pyrans. In one embodiment, the photochromic element includes a cured photochromic polymerizable composition.

Suitable thermochromic materials may contain an acid-responsive chromogenic substance and an acidic substance. Suitable acid-responsive chromogenic substances may include triphenylmethanephthalide compounds, phthalide compounds, phthalan compounds, acyl-leucomethylene blue compounds, fluoran compounds, triphenylmethane compounds, diphenylmethane compounds, spiropyran compounds, and the like. Other suitable acid-responsive chromogenic substances include 3,6-dimethoxyfluoran; 3,6-dibutoxyfluoran; 3-diethylamino-6,8-dimethylfluoran; 3-chloro-6-phenylaminofluoran; 3-diethylamino-6-methyl-7-chlorofluoran; 3-diethylamino-7,8-benzofluoran; 2-anilino-3-methyl-6-diethylaminofluoran; 3,3',3"-trispdimethyl amino phenylphthalide, 3,3'-bis p-dimethyl amino phenyl phthalide; 3-diethylamino-7-phenyl amino fluoran; 3,3-bis p-diethylaminophenyl-6-dimethyl amino phthalide; 3,4-diethylamino phenyl-3,1-ethyl-2-methylindol-3-ylphthalide; 3,4-diethylamino-2-methylphenyl-3,1,2-dimethylindol-3-ylphthalide; and 2',2-chloroanilino-6'-dibutylamino spiro phthalido-3,9'-xanthene. Suitable acidic substances include 1,2,3-benzotriazole compounds, phenol compounds, thiourea compounds, oxo-aromatic carboxylic acids, and the like. Specific examples of acidic compounds include 5-butylbenzotriazole; bis benzotriazole-5-methane; phenol; nonylphenol; bisphenol A; bisphenol F; 2,2'-biphenol; beta-naphthol; 1,5-dihydroxynaphthalene; alkyl p-hydroxybenzoates, phenol resin oligomer, and the like. The thermochromic materials may be used with a solvent. The use of a solvent may render the material responsive to change in temperature with greater sensitivity and definition. Suitable solvents may include alcohols; alcohol-acrylonitrile adducts; azomethine compounds; esters; and the like. Among specific examples of the solvent are decyl alcohol; lauryl alcohol; myristyl alcohol; cetyl alcohol; stearyl alcohol; behenyl alcohol; lauryl alcohol-acrylonitrile adduct; myristyl alcohol-acrylonitrile adduct; stearyl alcohol-acrylonitrile adduct; benzylidene-p-toluidine; benzylidene-butylamine; octyl caprate; decyl caprate; myristyl caprylate; decyl laurate; lauryl laurate; myristyl laurate; decyl myristate; lauryl myristate; cetyl myristate; lauryl palmitate; cetyl palmitate; stearyl palmitate; cetyl p-t-butylbenzoate; stearyl 4-methoxybenzoate; dilauryl thiodipropionate; dimyristyl thiodipropionate; stearyl benzoate; benzyl stearate; dibenzyl thiodipropionate; distearyl thiodipropionate; benzyl benzoate; and glycerol trilaurate.

Other suitable thermochromic materials may include intrinsically thermochromic material. Intrinsically thermochromic materials include chromophores that are chemically altered on heating without the need for an external reagent, and which change color in the process. Thermochromic colors including Fast Yellow Gold Orange, Vermillion, Brilliant Rose, Pink, Magenta, Fast Blue, Artic Blue, Brilliant Green, Fast Black, Green Brown and mixtures of the foregoing may be used in the thermochromic element. Rylene dyes may be employed in the thermochromic element. Reversible thermochromic pigments that change color in the presence of diaminoalkane activators may be used as the thermochromic element.

Passive light transformative elements employed in certain embodiments of the color-tunable light-emitting devices may include color filters and phosphors. A suitable color filter may be a sheet of dyed glass, gelatin, or plastic that absorbs certain colors and permits better rendition of others.

A phosphor exhibits the phenomenon of phosphorescence. Phosphorescence may be defined as sustained light emission following an initial exposure to light. This is sometimes referred to as "glowing without further stimulus". Suitable phosphors may include one or more transition metal compounds or rare earth compounds. The term "transition metal" refers to an element in the d-block of the periodic table, including zinc and scandium. This corresponds to periodic table groups 3 to 12, inclusive. Compounds of the "inner transition elements" from the lanthanide and actinide series where the inner f orbital is filled as atomic number increases may also be used as the phosphor. The inner transition elements are made up of the elements from cerium to lutetium; and thorium to Lawrencium. Suitable rare earth compounds include oxides of the elements in the lanthanide series that include actinium, thorium, protactinium, uranium, neptunium, plutonium, americium, curium, berkelium, californium, einsteinium, fermium, mendelevium, nobelium and lawrencium.

The reflective elements that can be employed in certain embodiments include mirrors and retroreflective layers. Mirrors may be formed from highly reflective metallic foils or metal film on a substrate.

In one embodiment, the controller is light transmissive. In one embodiment, the controller may include a transparent thin film transistor TFT. A TFT is an active device, which is the building block for electronic circuits that switch and amplify electronic signals. Attractive TFT device characteristics include a low voltage to turn it on, a high transconductance or device current to gate control-voltage ratio Vg, and a high 'on' Vg greater than 0 current to 'off' Vg less than or equal to 0 current ratio. The TFT may be fabricated in such a manner that materials used in the different elements of the TFT, such as a source electrode, a drain electrode, a gate electrode, a gate dielectric and a substrate, should result in a transparent TFT.

The substrate can be used as a support during the manufacturing, testing, and/or use of the TFTs. The substrate used may be same or similar to the substrate as discussed above. Depending on the method of making the transistor, the substrate may be an optional element. In one embodiment, the support does not provide any necessary electrical function for the TFT and hence functions as an insulator. Suitable substrate materials may include organic or inorganic materials and may be rigid or flexible. Suitable substrates include inorganic materials and inorganic materials. The inorganic materials suitable for substrates may include glass, ceramic, and metal. The organic materials may include polymeric materials such as acrylics, epoxies, polyamides, polycarbonates, polyimides, polyketones, polyoxy-1,4-phenyleneoxy-1,4-phenylenecarbonyl-1,4-phenylene, polynorbornenes, polyphenyleneoxides, polyethylene naphthalenedicarboxylate (PEN), polyethylene terephthalate (PET), polyether sulfone (PES), and polyphenylene sulfide (PPS). The ceramics and the organics may be reinforced with, for example, fibers and/or particles. Flexible substrates may be thin metal foils provided they are coated with an insulating layer to electrically isolate the thin film transistor.

Conductive materials may be used as the gate electrode. Suitable conductive materials include doped silicon, or a metal, such as aluminum, chromium, gold, silver, nickel, copper, tungsten, palladium, platinum, tantalum, and titanium, transparent conductors such as indium-tin oxide (ITO), zinc oxide, tin II oxide, or lanthanum III dioxide; conductive polymers such as polyaniline, poly 3,4-ethylene dioxythiophene and polystyrene sulfonate (PEDOT:PSS). In addition, alloys, combinations, and multilayers of these materials may be useful. In some embodiments, the same material can provide the gate electrode function and also provide the support function of the substrate. For example, doped silicon can function as the gate electrode and the substrate for TFT. In one embodiment, the thickness of the gate electrode may be such that the gate electrode does not hinder or reduce the efficiency of light transmitted through the device.

In a TFT, the gate dielectric contacts the gate electrode. This gate dielectric electrically insulates the gate electrode from the balance of the TFT device. Thus, the gate dielectric includes an electrically insulating material. The gate dielectric should have a suitable dielectric constant that can vary widely depending on the particular device and circumstance of use. For example, a dielectric constant of from about 2 to about 100 may be available as a gate dielectric. Suitable materials that may be used for the gate dielectric may include one or more strontiates, tantalates, titanates, zirconates, aluminum oxides, silicon oxides, tantalumoxides, titanium oxides, silicon nitrides, barium titanate, barium strontium titanate, barium zirconate titanate, zinc selenide, or zinc sulfide. In addition, alloys, combinations, and multilayers of the foregoing; polymeric materials such as polyimides, polyvinyl alcohol, poly-4-vinylphenol, polyimide, and polyvinylidene fluoride, polystyrene and substituted derivatives thereof, polyvinyl naphthalene and substituted derivatives, and polymethyl methacrylate. In one embodiment, the thickness of the gate dielectric is such that the gate dielectric does not hinder or reduce the efficiency of light transmitted through the device.

Source/drain electrodes refer to the terminals of a TFT, between which conduction occurs under the influence of an electric field. The source electrode and drain electrode are separated from the gate electrode by at least the gate dielectric, while the conducting channel can be over or under the source electrode and drain electrode. The source and drain electrodes can be any useful conductive material. Suitable materials include most of those materials described above for the gate electrode. These gate electrode materials may include aluminum, barium, calcium, chromium, gold, silver, nickel, palladium, platinum, titanium, copper, and tungsten. Other gate electrode materials may be a conductive polymer, such as polyaniline. Other suitable materials may include n-type conductors such as indium-tin oxide (ITO), oxides of zinc, tin and lanthanum. In one embodiment, the thickness of the source/drain electrodes may be such that the source/drain electrodes do not hinder or reduce the efficiency of light transmitted through the device.

In one embodiment, the material employed in the conducting channel of the thin film transistor may be a zinc oxide-based semiconductor thin film transistor employing zinc-oxide-based nanoparticles. In one embodiment, the zinc-oxide-based semiconductor materials are "n-type," although, through the use of suitable dopants, p-type materials are also envisioned. The zinc-oxide-based semiconductor material can contain other metals capable of forming semiconducting oxides such as indium, tin, or cadmium, and combinations thereof. Minor amounts of acceptor dopants can also be included. Semiconductor films described above are capable of exhibiting, in the film form, excellent field-effect electron mobility of greater than 0.01 square centimeter/Volts-Second and on-off ratios of greater than 104, enabling their use in a variety of relevant technologies, including active matrix display backplanes.

Other suitable materials having specific thickness that may be employed in the conducting channel of the thin film transistor. Suitable materials may include metals like Al, Ag, Au, Ba, Ca, In, K, Li, Mg, Mn, Na, Pb, Sr, Sn, Sc, Y, Zn, and Zr. Other suitable materials may include elements of the lanthanide series. Suitable relatively low work function value alloys may include Ag—Mg alloy, Al—Li alloy, In—Mg alloy, Al—Ca alloy, Li—Al alloy, and Ca—Ga alloy. These low work function value cathode materials may be present in the metallic form or as a n-type dopant dispersed in an organic matrix. Other examples may include alkali metal fluorides or alkaline earth fluorides. Other suitable materials may include metal oxides, such as indium-tin oxide, tin oxide, indium oxide, zinc oxide, indium-zinc oxide, zinc indium-tin oxide, and transition metal oxides such as vanadium oxide ($V_2O_5$), molybdenum oxide ($Mo_2O_3$), and antimony oxide ($Sb_2O_3$). In one embodiment, an organic suitable cathode may be fashioned from carbon nanotubes. The cathode can be made of multiple layers to enhance electron injection. Non-limiting examples of multi-layer cathodes may include an inner layer of either LiF or NaF with an outer layer of aluminum or silver; and an inner layer of calcium with by an outer layer of aluminum or silver. In one embodiment, the thickness of the conducting channel may such that the conducting channel does not hinder or reduce the efficiency of light transmitted through the device.

In one embodiment, the conducting channel of the transistor includes at least one carbon nanotube network. Additionally, at least one of the remaining three components of the transistor i.e., the source electrode, the drain electrode and the gate electrode, may include at least one carbon nanotube network. A carbon nanotube transistor can be employed where a carbon nanotube network provides the source and drain, the conducting channel and the gate electrode; or a carbon nanotube network used for the source and drain; and a carbon nanotube network used for the conducting channel; or a carbon nanotube network used for the source and drain; and a carbon nanotube network used for the gate; or a carbon nanotube network used for the gate; and a carbon nanotube network used for the conducting channel.

The carbon nanotubes used to make the networks can be undoped, or can be doped for p-type transistors and n-type transistors. The networks may include two differing species, such as carbon nanotubes and polyaniline to provide different conducting properties; the networks with differing densities at different locations on the substrate may be used; the networks can be patterned on the surface to provide some areas that are covered some areas that are not covered. Other nanomaterials may be employed in conjunction with or as a replacement for the carbon nanotubes. Suitable nanomaterials include nano-wires having dimensions less than 900 nanometers in diameter (the diameter is the average of the cross-sectional width) and having an aspect ratio exceeding 10. Suitable nanomaterials may include single element nano-wires made from silicon, from a combination of Group III-V materials, from a combination of Group II-VI, from metal oxides, or from metal chalcogenides Suitable Group III-V materials may include Ga, In, N, P, As and Sb. Suitable Group II-VI materials may include Zn, Cd, Hg, S, So and Te. Suitable metal chalcogenides may include Mn, Fe, Co, Ni, Cu, Ag, Sn, Pb and Bi. Other suitable metal chalcogenides may include metal oxides such as CdO, $Ga_2O_3$, $In_2O_3$, MnO, NiO, PbO, $Sb_2O_3$, $SnO_2$, and ZnO. Other suitable nanomaterials may include conducting polymers polyaniline, polypyrrole, and polythiophene. And, yet other suitable nanomaterials may include metals and alloys.

In one embodiment, the components that emit light may include a light-emitting nano-wire device. In one embodiment, the light-emitting nano-wire device may be light transmissive. With regard to the light-emitting nano-wire device, it may include an electrically conductive element and a light-emitting nano-wire device including at least one p-n or p-i-n diode. The electrically conductive element may be light transmissive.

In one embodiment, the light-emitting nano-wire device is a p-n diode or multiple p-n diodes. In various embodiments, the light emitting nano-wires may be oriented either in a vertical direction or in a horizontal direction in the light-emitting nano-wire device. In a light-emitting p-n diode, light emits at interface of p-type segment and n-type segment. Some light emitted along the axis of the nano-wire may be absorbed by the nano-wire. In another embodiment, the light-emitting nano-wire device is a p-i-n diode or multiple p-i-n diodes. In a p-i-n diode, light emits from the i-layer. The i-layer is a quantum well or multiple quantum wells. P segment and n-segment in the nano-wire have larger bandgap than the i-layer and therefore are transparent to the light emitted along the nano-wire axis. In another embodiment, the light-emitting nano-wire is a core layer/inner shell/outer shell radial p-n junction or p-i-n heterojunction. The core layer may include either a p-type or an n-type semiconductor. The outer shell may include either an n-type or a p-type semiconductor, such that a p-n junction may be formed between the core layer and the outer shell. An inner shell may be inserted between the core layer and the outer shell. The inner shell may be an undoped layer, a quantum well or multiple quantum wells capable of emitting light.

In one embodiment, the electrically conductive element may include a single component including any useful conductive material.

In another embodiment, the electrically conductive element may additionally include a light transmissive substrate wherein the conductive material may be disposed on the light transmissive substrate to provide the electrically conductive element. Suitable materials that may be used as the light transmissive substrate may be the same as or similar to the substrate described above. Suitable materials that may be used as the conductive material may be the same as or similar to the conductive material used in the source/drain electrodes described above for the controller. Suitable light transmissive controllers may include the light transmissive controllers described above.

In one embodiment, the light-emitting nano-wire device may include multiple nano-wire light-emitting diodes. Each may include a structure of a p-type semiconducting segment and an n-type semiconducting segment. Optionally, an undoped light-emitting segment is inserted between p-type segment and n-type segment. Suitable materials that may be used as the light-emitting nano-wires include a semiconductor light-emitting material selected from III-V or II-VI semiconductors with a direct bandgap. Suitable semiconductor materials may include gallium nitride, zinc selenide, gallium arsenide, or zinc oxide.

In one embodiment, the light-emitting nano-wire device may include a cover layer disposed on the electrically conductive element. The cover substrate may provide a more robust light-emitting nano-wire device. Suitable materials that may be used as the cover substrate may be the same as or similar to the material described above for the light transmissive substrate.

In one embodiment, the cover substrate may have a surface plated with a metal layer. Suitable materials that may be used as metal layer include Al, Ag, Au, Ba, Ca, In, K, Li, Mg, Mn, Na, Pb, Sr, Sn, Sc, Y, Zn, Zr, and elements of the lanthanide series. Other suitable materials may include metal alloys, such as Ag—Mg alloy, Al—Li alloy, In—Mg alloy, Al—Ca alloy, Li—Al alloy, and Ca—Ga alloy. In one embodiment, the metal layer on the cover substrate and the electrically conductive element may serve as electrode conductors.

In various embodiments, the nano-wire light-emitting diodes may be grown using a vapor phase-liquid phase-solid phase (VLS) growth technique or a metal-organic chemical vapor deposition (MOCVD) growth technique.

In one embodiment, a layer of a metal catalyst may be deposited by e-beam evaporation, thermal evaporation or sputtering on the surface of the electrically conductive element and the coated element may be placed in an oven to heat to a temperature of about 400 degrees Celsius to about 1000 degrees Celsius resulting in the formation of nano sized catalytic nano-particles. This may be followed by passing vapors of precursors containing a semiconductor light-emitting material and suitable dopants to form p-type semiconductor and n-type semiconductor over the catalytic nano-particles resulting in the growth of nano-wire light-emitting diodes on the surface of the electrically conductive element. In one embodiment, the light-emitting nano-wires may be grown on the cover substrate in a similar manner as described above. Suitable materials that may be used as the metal catalyst may include gold, nickel, iron, cobalt, and/or titanium. In one embodiment, the thickness of the layer of metal catalyst is in a range of from about 1 nanometer to about 50 nanometers. In another embodiment, the catalyst may be uniformly dispersed catalytic nano-particles.

Optionally, an insulation layer support post may be disposed between the electrically conductive element and the cover substrate for supporting the electrically conductive element and the cover substrate. In one embodiment, the insulation layer support post may be disposed on the electrically conductive element. In one embodiment, the insulation layer support post may be disposed on the cover substrate. Suitable materials that may be used to make the insulation layer support post include silica and a heat-proof light-resistant material.

In one embodiment, the light-emitting nano-wire device include nano-wire light-emitting diodes which may form a light-emitting block, and a single light-emitting block or multiple light-emitting blocks may form a planar light source. In one embodiment, the nano-wire light-emitting diodes may emit rays in a wavelength region of about 350 nanometers to 395 nanometers (ultraviolet rays) in a wavelength region of about 395 nanometers to about 420 nanometers (violet rays), or in a wavelength region of about 420 nanometers to about 430 nanometers (yellow rays), or in a wavelength region of about 430 nanometers to about 470 nanometers (blue rays).

Referring to FIG. 1, an article 10 includes a display structure having a height 12, width 14 and a thickness 16 that defines a volume. The display structure includes a stack including layers 18. The layers may be placed apart as shown in article 10 or may be bonded together to form an article 20.

Figure 2:
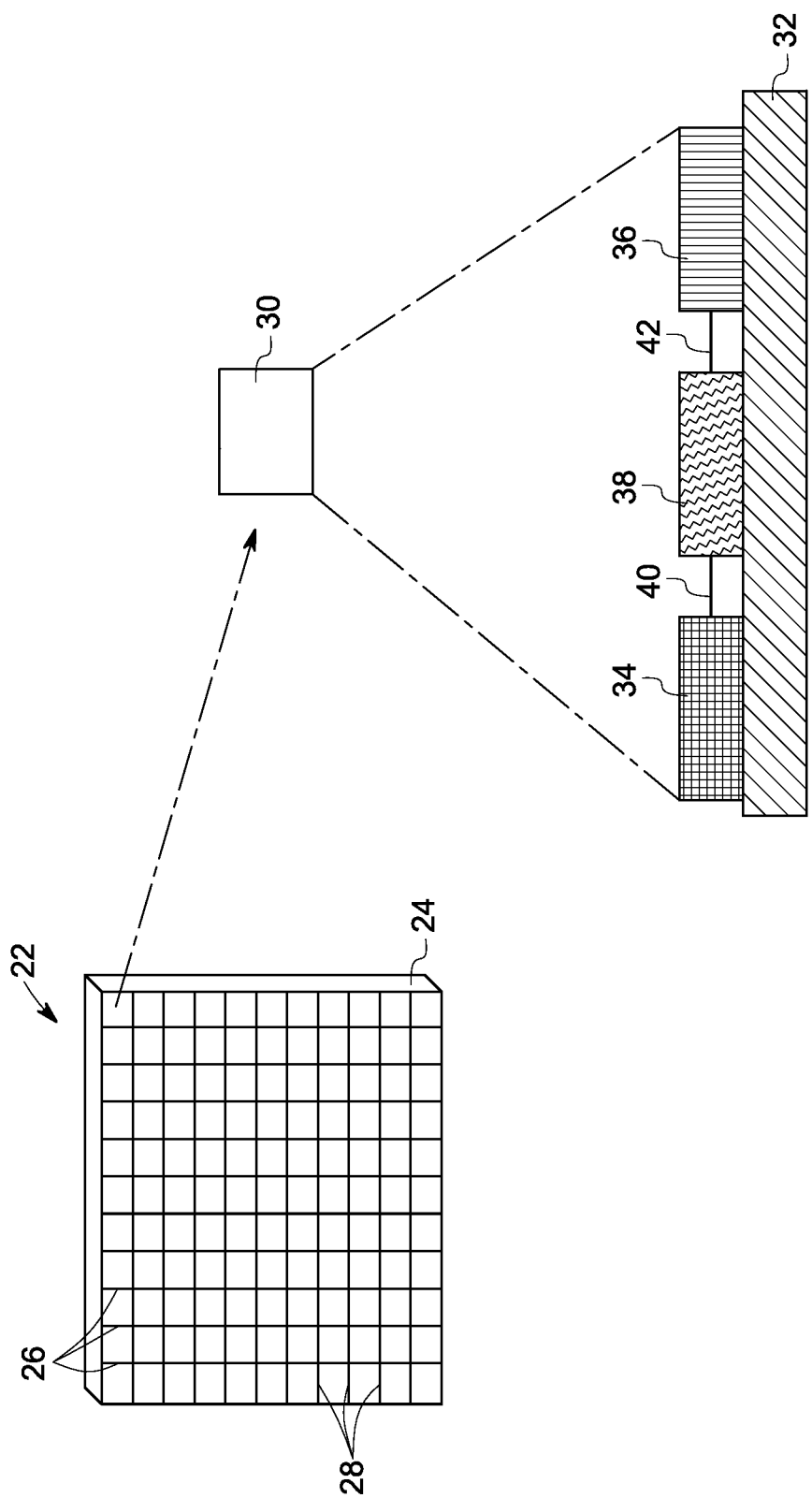
FIG. 2 is a schematic representation of an embodiment of the invention.

Referring to FIG. 2, an article 22 includes a stack 24 having a single layer. The vertical grid lines 26 and the horizontal grid lines 28 on the surface of the stack identify pixels 30 in the layer. Each pixel includes a substrate 32, a first organic electronic device 34, a second organic electronic device 36 and a controller 38. The controller connects to both the first light transmissive organic electronic device and the second light transmissive organic electronic device. The controller can control the first light transmissive organic electronic device and the second light transmissive organic electronic device by varying an applied voltage bias 40 and 42, respectively.

Figure 3:
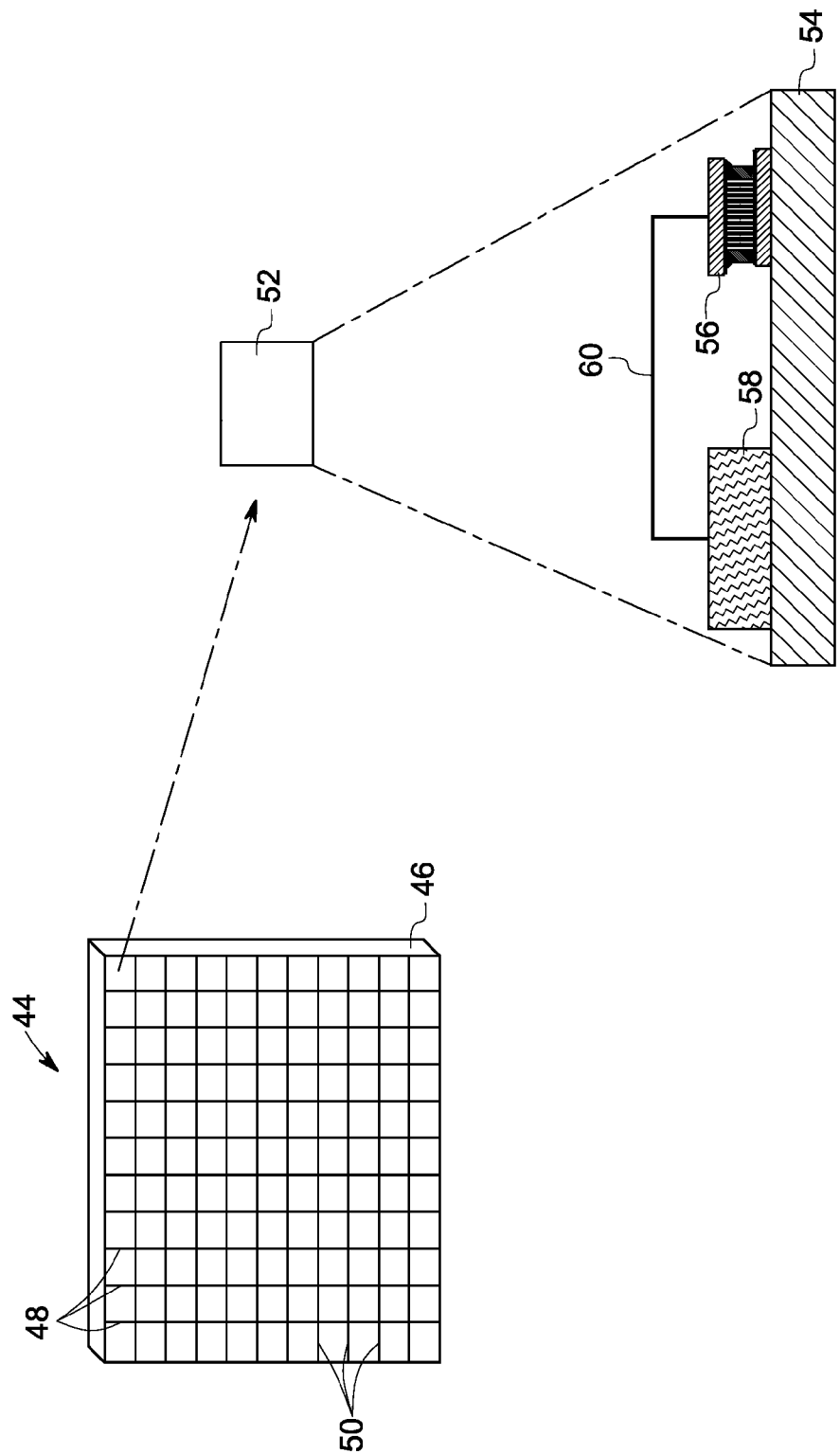
FIG. 3 is a schematic representation of an embodiment of the invention.

Referring to FIG. 3, an article 44 includes a stack 46 having a single layer. The vertical grid lines 48 and the horizontal grid lines 50 on the surface of the stack identify pixels 52 in each layer of the stack. Each pixel includes a substrate 54, a light-emitting nano-wire device 56 and a controller 58. The controller connects to the light-emitting nano-wire device. The controller can control the light-emitting nano-wire device by varying an applied voltage bias 60

Figure 4:
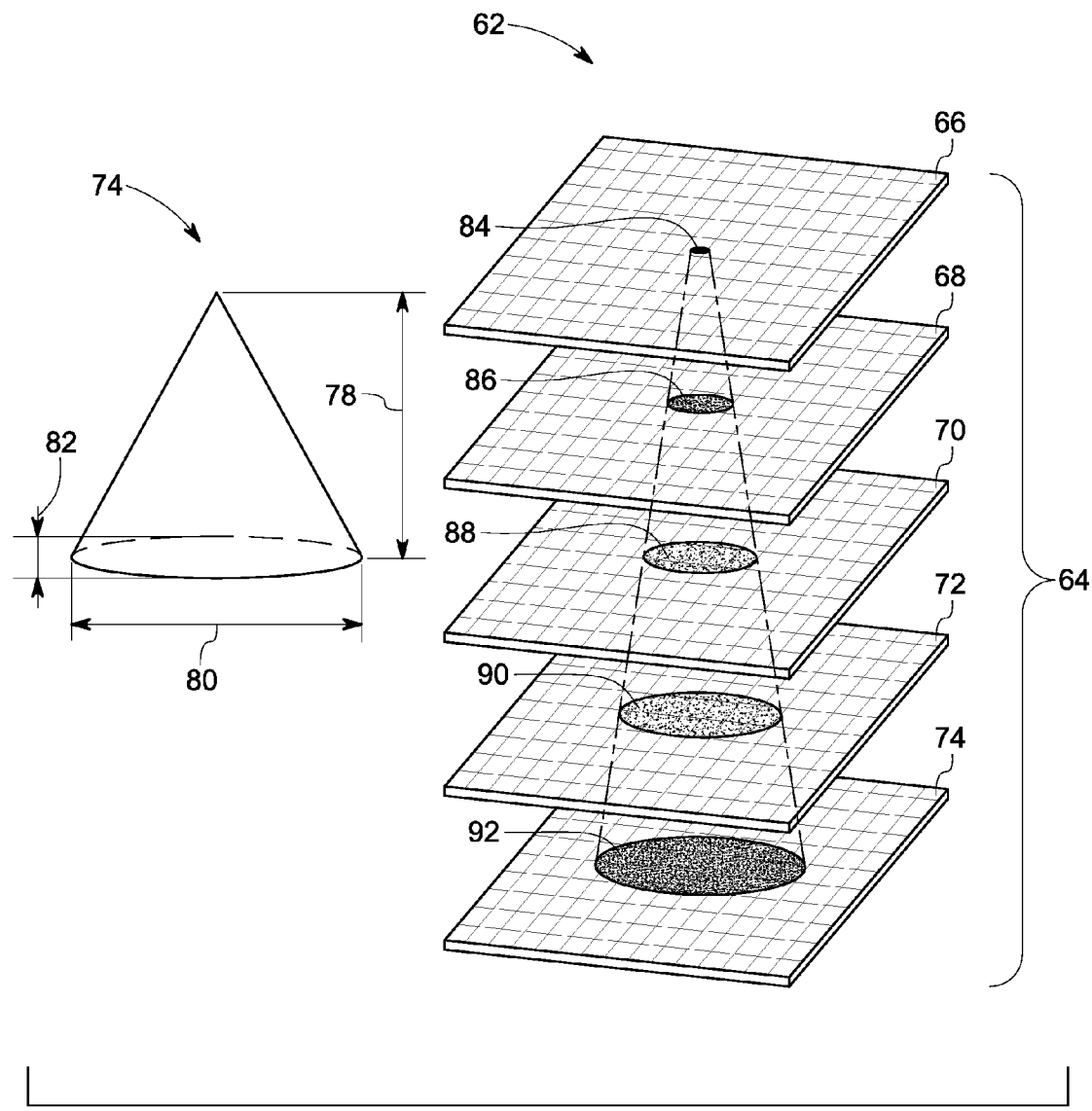
FIG. 4 is a schematic representation of an embodiment of the invention.

Referring to FIG. 4, an article 62 includes a stack 64 including layers 66, 68, 70, 72 and 74. A three-dimensional image of a cone 76 having a height 78, length 80 and a width 82 is generated within the volume of the stack. As indicated in the FIG. 4, the components that emit light which are present in the pixels in region 84 in layer 66 are switched on providing a circular portion that emits light. The components that emit light in the remaining portion are switched off thus providing a dark background. This arrangement is repeated by switching on the pixels in region 86 in layer 68, region 88 in layer 70, region 90 in layer 72 and region 92 in layer 74. The number of pixels switched on by the controller gradually increases from layer 66 to layer 74 and thus the size of the circular portion that emit lights is gradually increased. This generates a three-dimensional image of a cone within the article.

Figure 5:
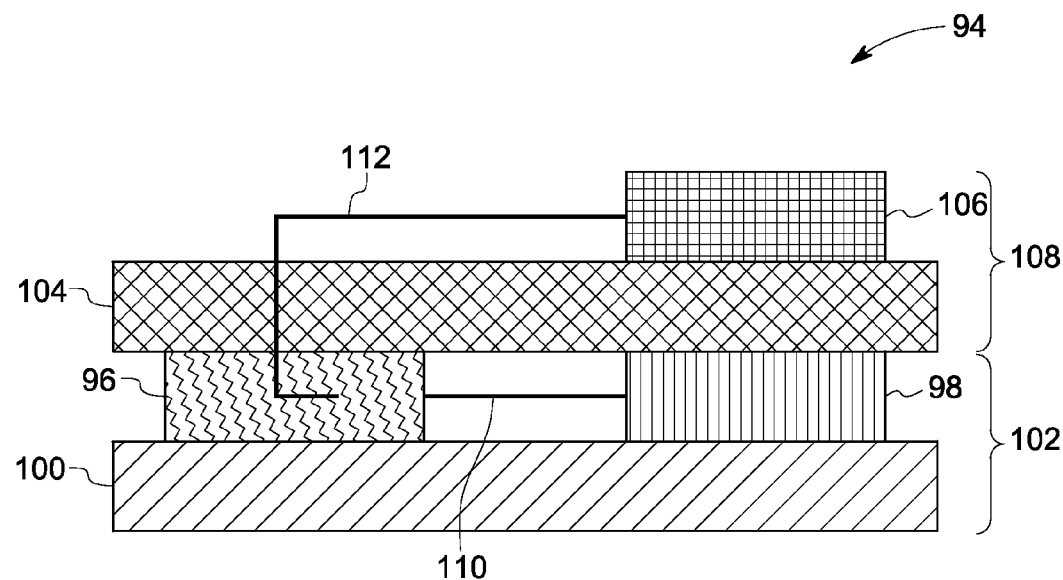
FIG. 5 is a schematic representation of an embodiment of a component that emits light.
Figure 6:
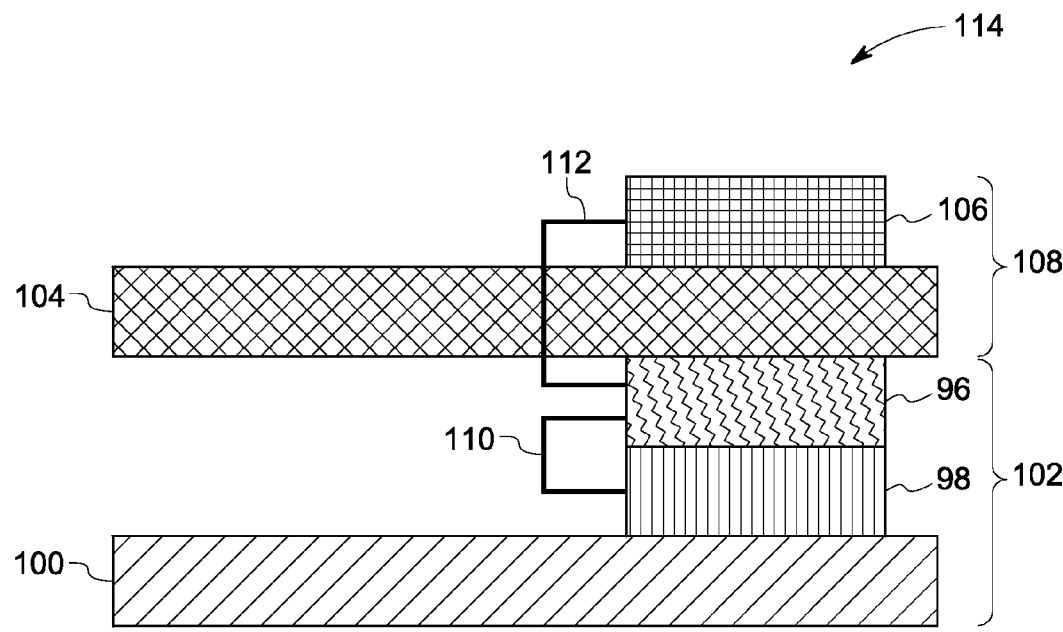
FIG. 6 is a schematic representation of an embodiment of a component that emits light.
Figure 7:
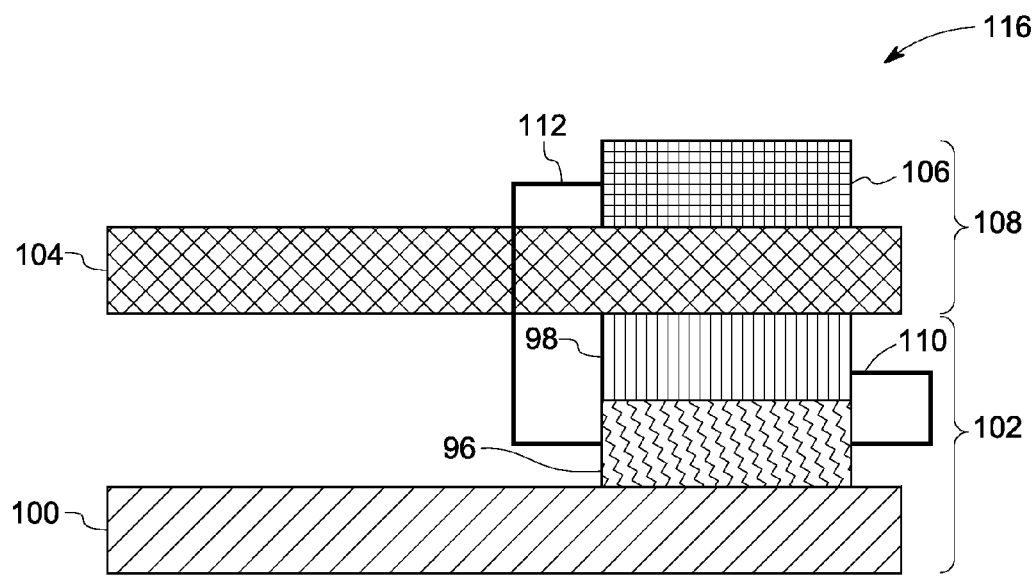
FIG. 7 is a schematic representation of an embodiment of a component that emits light.

Various arrangements may be possible for the different elements included in the pixels shown in FIG. 2. A component that emits light 94 (FIG. 5) includes a controller 96 and a first organic electronic device 98. Both secure to a substrate 100 to form a first layer 102 of the device. A second substrate 104 is disposed over the first layer of the device, and a second organic electronic device 106 is secured to the second substrate to form a second layer 108. The controller connects to both the first organic electronic device and the second organic electronic device. The controller can control the first organic electronic device and the second organic electronic device by varying an applied voltage bias 110 and 112, respectively. A component that emits light 114 (FIG. 6) and component that emits light 116 (FIG. 7) each have the same description as provided above for the component that emits light 94. One difference lies in the arrangement of the elements. In FIG. 6, the first organic electronic device secures directly to the surface of the first substrate, and the controller secures to an outward facing surface of the first organic electronic device (which is sandwiched therebetween). In FIG. 7, the controller secures directly to the surface of the first substrate, and the first organic electronic device secures to the outward facing surface of the controller.

Figure 8:
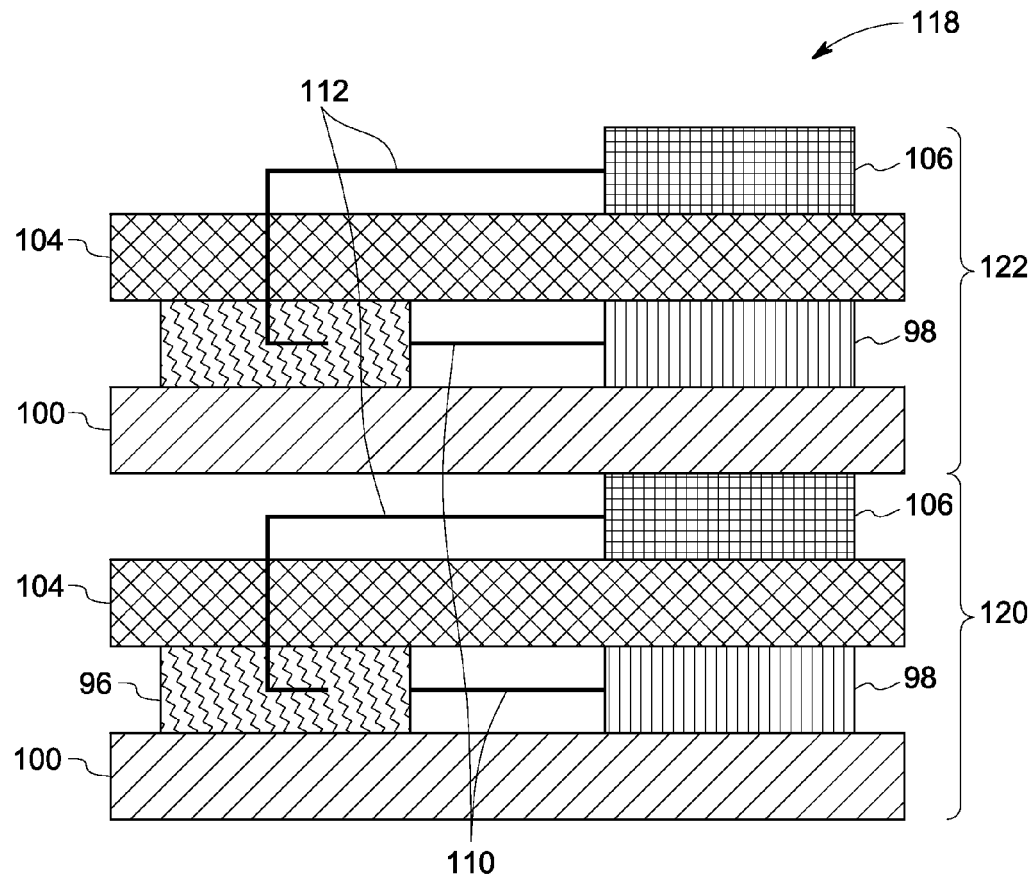
FIG. 8 is a schematic representation of an embodiment of a component that emits light.

Referring to FIG. 8, two of the components that emit light as shown in FIG. 4, are overlaid and stacked together to form a component that emits light 118. The first stack device 120 and the second stacked device 122 each include a controller and a organic electronic device that are secured to a respective substrates. The substrate in this embodiment may be an unreinforced, flexible thermoplastic sheet having a thickness of about 0.25 millimeters, and a transparency or light transmission of greater than 85 percent at 550 nanometers wavelength. The organic electronic device in the first stack device is red. In the first stack device, the controller connects to both the first organic electronic device and the second organic electronic device. and controls both the organic electronic devices by varying the applied voltage bias. The organic electronic device in the second stack device is blue, and has a green phosphor operably coupled thereto. The first organic electronic device and the second organic electronic device may emit light at different wavelengths. For example, the first organic electronic device may be a blue light-emitting diode and the second organic electronic device may be a red light-emitting diode. Alternately, a different combination of organic electronic device, each of which emit light at different wavelengths, may be used. The perceived color of the light emerging from the article is a combination of the unmodulated light emerging directly from the article and the modulated light, the modulated light being modulated by the controller.

Figure 9:
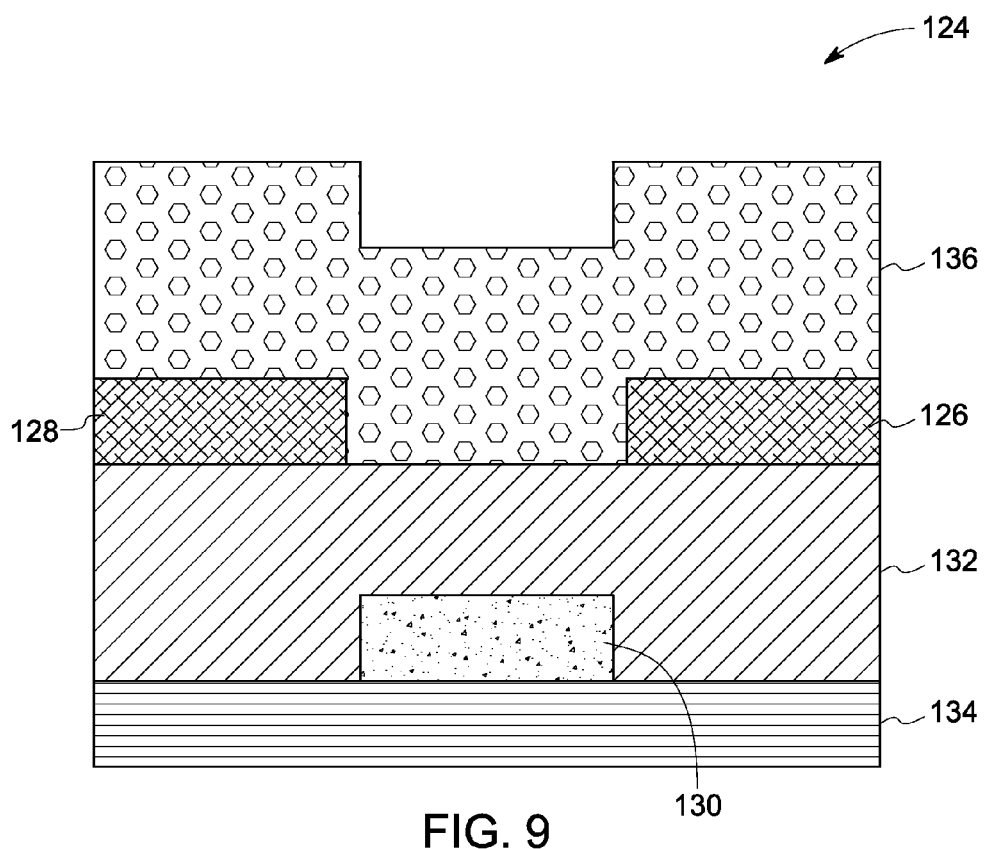
FIG. 9 is a cross-sectional view of a thin film transistor having a bottom-gate/bottom-contact configuration.
Figure 10:
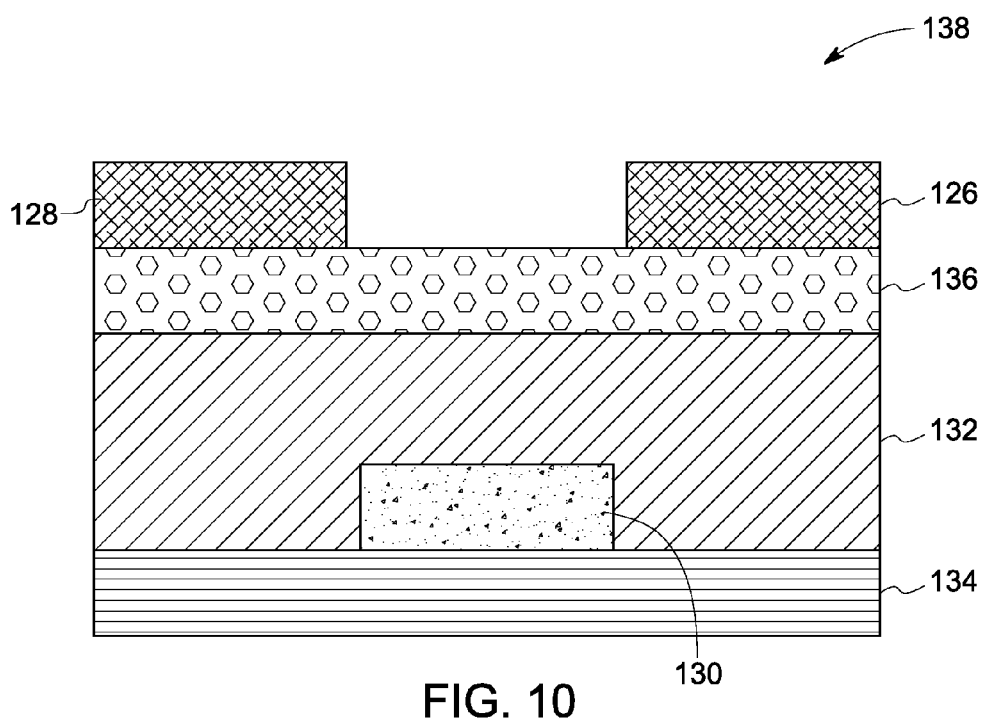
FIG. 10 is a cross-sectional view of a thin film transistor having a bottom-gate/top-contact configuration.

Referring to FIGS. 9 and 10, the controllers 124 and 138, include a source electrode 126, a drain electrode 128, a gate electrode 130, a gate dielectric 132, a substrate 134, and the conducting channel 136 used in the invention in the form of a film connecting the source electrode to drain electrode. When the controller operates in an enhancement-mode, the charges injected from the source electrode into the semiconductor are mobile and a current flows from source to drain electrode, mainly in a thin channel region within 100 Angstroms of the conduction channel-gate dielectric interface. In the configuration of FIG. 9, the charge may be injected laterally from the source electrode to form the conducting channel. In the absence of a gate field the conducting channel has few charge carriers; as a result there is ideally no source-drain conduction when the device is in off mode. The off current is defined as the current flowing between the source electrode and the drain electrode when charge has not been intentionally injected into the conducting channel by the application of a gate voltage. This occurs for a gate-source voltage that is more negative, assuming an n-channel, than a certain voltage known as the threshold voltage. The on current is defined as the current flowing between the source electrode and the drain electrode when charge carriers have been accumulated intentionally in the channel by application of an appropriate voltage to the gate electrode, and the conducting channel is conducting. For an n-channel accumulation-mode controller, this occurs at gate-source voltage more positive than the threshold voltage. It is desirable for this threshold voltage to be zero, or slightly positive, for n-channel operation. Switching between on and off is accomplished by the application and removal of an electric field from the gate electrode across the gate dielectric to the conducting channel-gate dielectric interface, effectively charging a capacitor.

Figure 11:
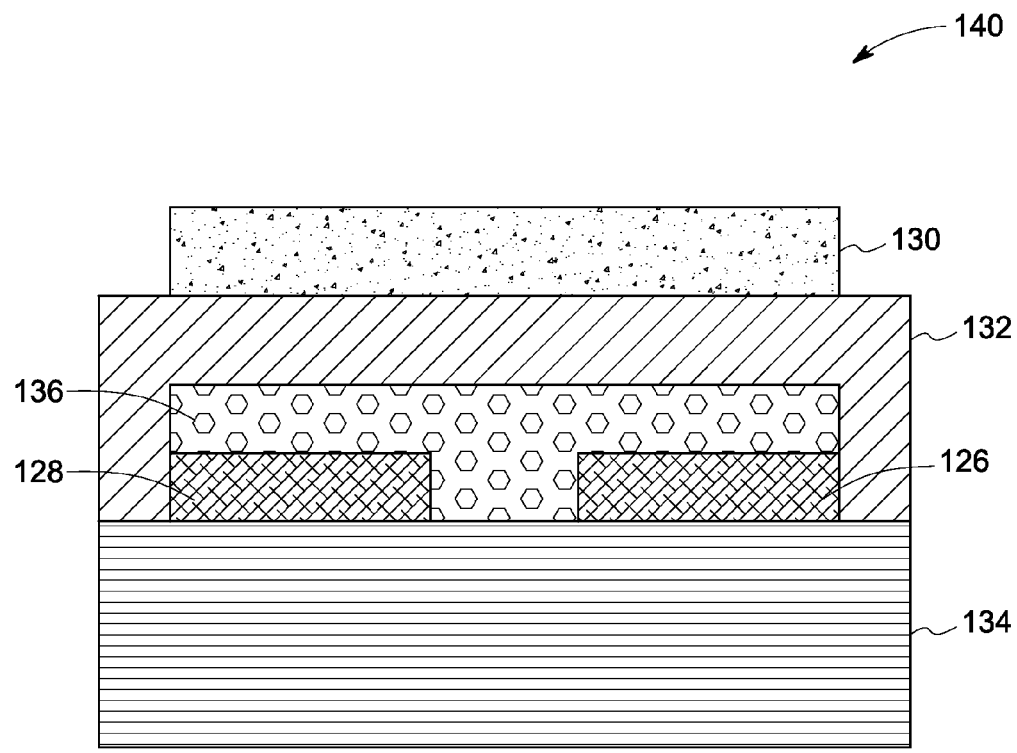
FIG. 11 is a cross-sectional view of a thin film transistor having a top-gate/bottom-contact structure.

Referring to FIG. 11, the controller 140, includes an insulating substrate 136 upon which is disposed a source electrode 128 and a drain electrode 130. A conducting channel 138 is provided such that contact between the source and drain electrodes is made. A gate electrode 134 is disposed on the top surface from a vertical perspective of the gate dielectric 132. In other words, the gate electrode and the conducting channel are provided on opposing surfaces of the gate dielectric.

Figure 12:
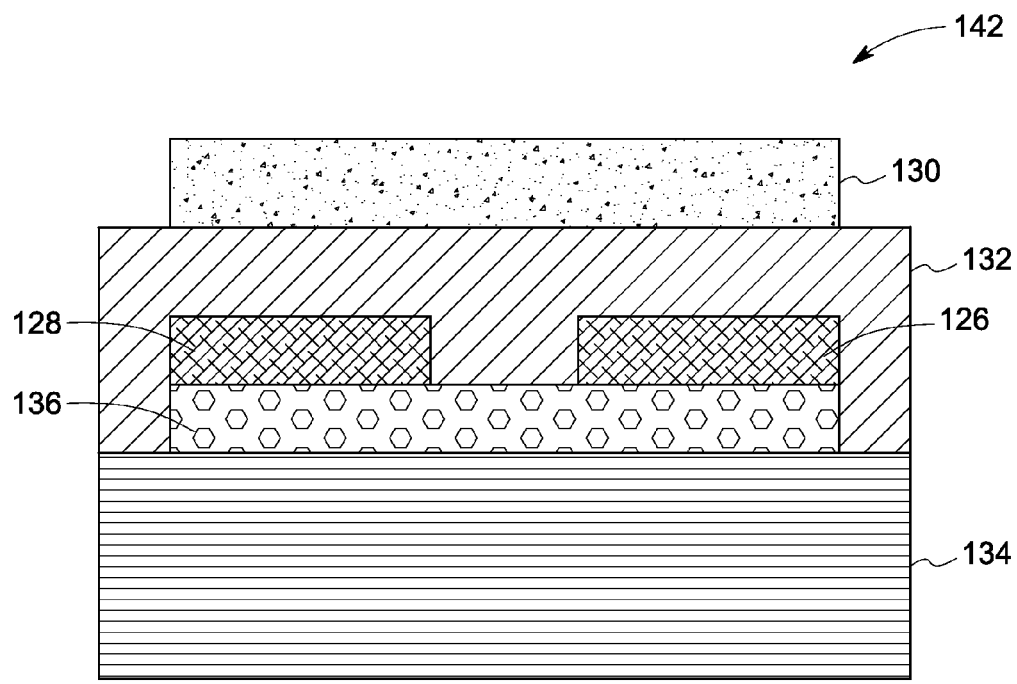
FIG. 12 is a cross-sectional view of a thin film transistor having a top-gate/top-contact structure.

Referring to FIG. 12, the controller 142, includes an insulating substrate 136 upon which is disposed a conducting channel 138. A source electrode 128 and a drain electrode 130 are disposed on a surface of the conducting channel that is adjacent to the substrate. A gate electrode 134 is disposed on the top surface from a vertical perspective of the gate dielectric 132. In other words, the gate electrode and the conducting channel are provided on opposing surfaces of the gate dielectric.

Figure 13:
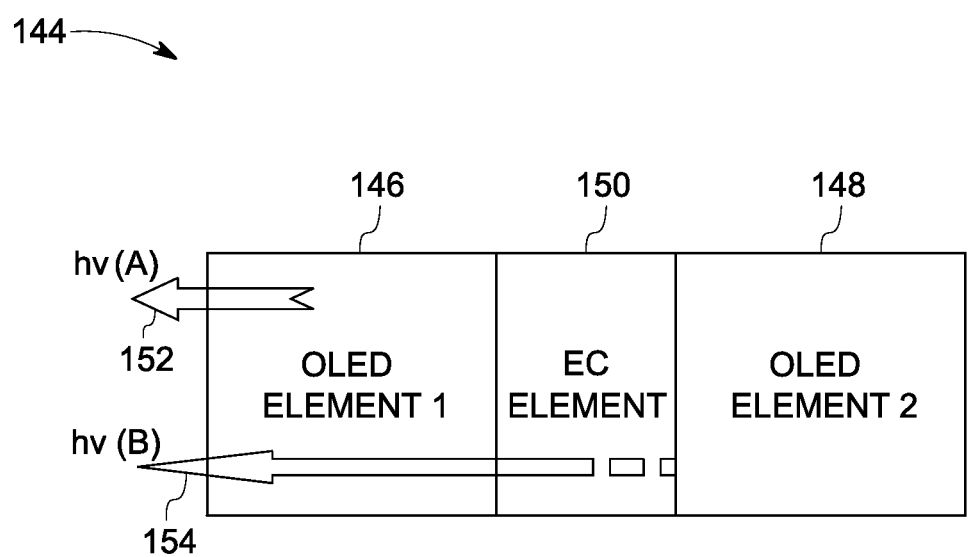
FIG. 13 is a schematic representation of the change in color emitted from a color-tunable light-emitting device.

Referring to FIG. 13, the color-tunable light-emitting device 144 includes a first OLED 146 and a second OLED 148 emitting light at different wavelengths. In one embodiment the first OLED may be a blue light-emitting OLED and the second OLED may be a red light-emitting OLED. Alternately, a different combination of OLED that emit light at different wavelengths may be used. For example the first OLED may be a red light-emitting OLED and the second OLED may be a blue light-emitting OLED. The transmission properties of the electrochromic EC element 150 can be tuned by varying an applied voltage bias. The perceived color of the light emerging from the device is thus a combination of the unmodulated light 152 emerging directly from the device and the modulated light 154, said modulated light being modulated by the electrochromic element. In one embodiment, the electrochromic element is substituted with a photochromic element. Where a photochromic element is used, the photochromic element can be tuned by coupling with a light tunable source. In one embodiment, the electrochromic element is replaced with a thermochromic element. When a thermochromic element is used the thermochromic element can be tuned by coupling with a temperature tunable source.

Figure 14:
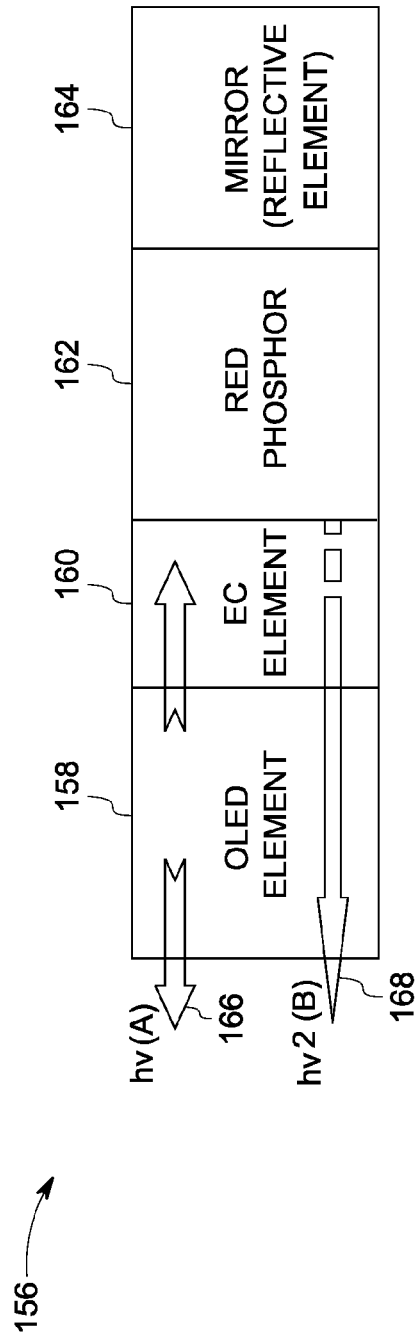
FIG. 14 is a schematic representation of an embodiment of a color-tunable light-emitting device.

Referring to FIG. 14, the color-tunable light-emitting device 156 includes an OLED 158, an active light transformative element, here an electrochromic element 160, a passive light transformative element, here a red phosphor layer 162, and a reflective element, here a mirror 164. The transmission properties of the electrochromic element can be tuned by varying an applied voltage bias. The perceived color is thus a combination of the unmodulated light 166 emerging directly from the device and modulated light 168, said modulated light being modulated by one or more of the light transformative elements. In one embodiment, the electrochromic element is replaced with a photochromic element. When a photochromic element is used the photochromic element can be tuned by coupling with a tunable light source. In yet another embodiment, the electrochromic element is replaced with a thermochromic element. When a thermochromic element is used the thermochromic element can be tuned by coupling with a temperature tunable source.

Figure 15:
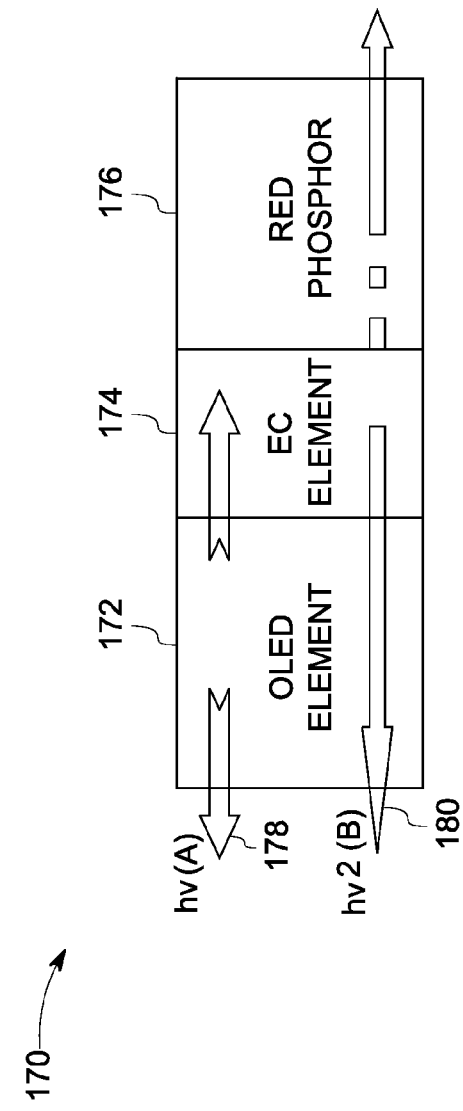
FIG. 15 is a schematic representation of an embodiment of a color-tunable light-emitting device.

Referring to FIG. 15 the color-tunable light-emitting device 170 includes a an OLED 172, an active light transformative element which is an electrochromic element 174, and a passive light transformative element, here a red phosphor 176; the transmission of the electrochromic element can be tuned by varying an applied voltage bias. The perceived color is thus a combination of the unmodulated light 178 emerging directly from the device and modulated light 180, said modulated light being modulated by one or more of the light transformative elements.

The reflective elements that can be employed in certain embodiments include but are not limited to mirrors and aluminum film. Mirrors may include highly reflective metallic foils, or a metal film on a glass or a plastic substrate.

Figure 16:
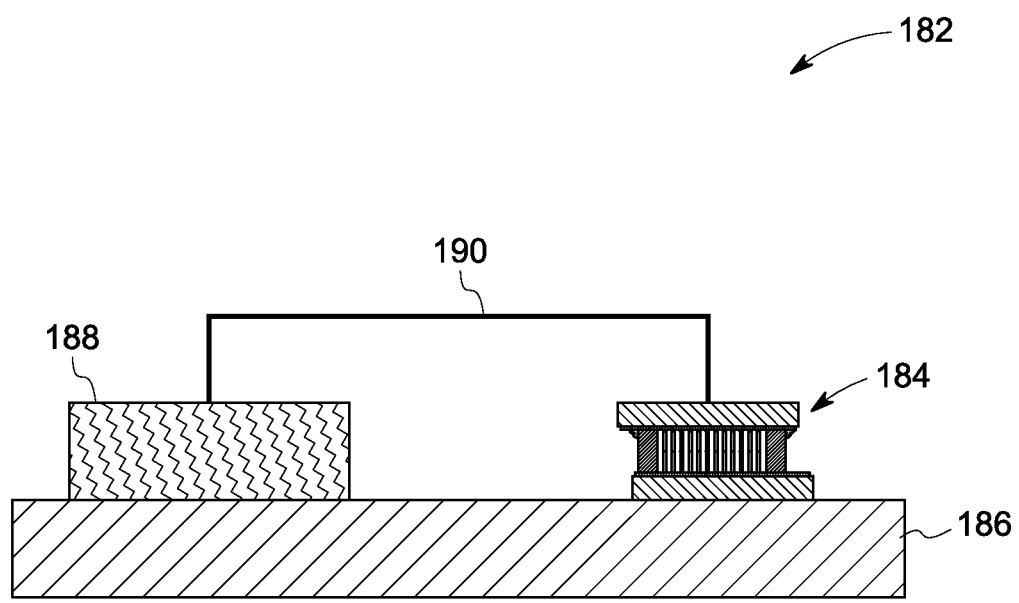
FIG. 16 is a cross-sectional view of an embodiment of a light-emitting nano-wire device.

Referring to FIG. 16, a component that emits light 182 includes a controller 188 and a light-emitting nano-wire device 184. Both secure to substrate 186. The controller can control the light-emitting nano-wire device by varying an applied voltage bias 190.

Figure 17:
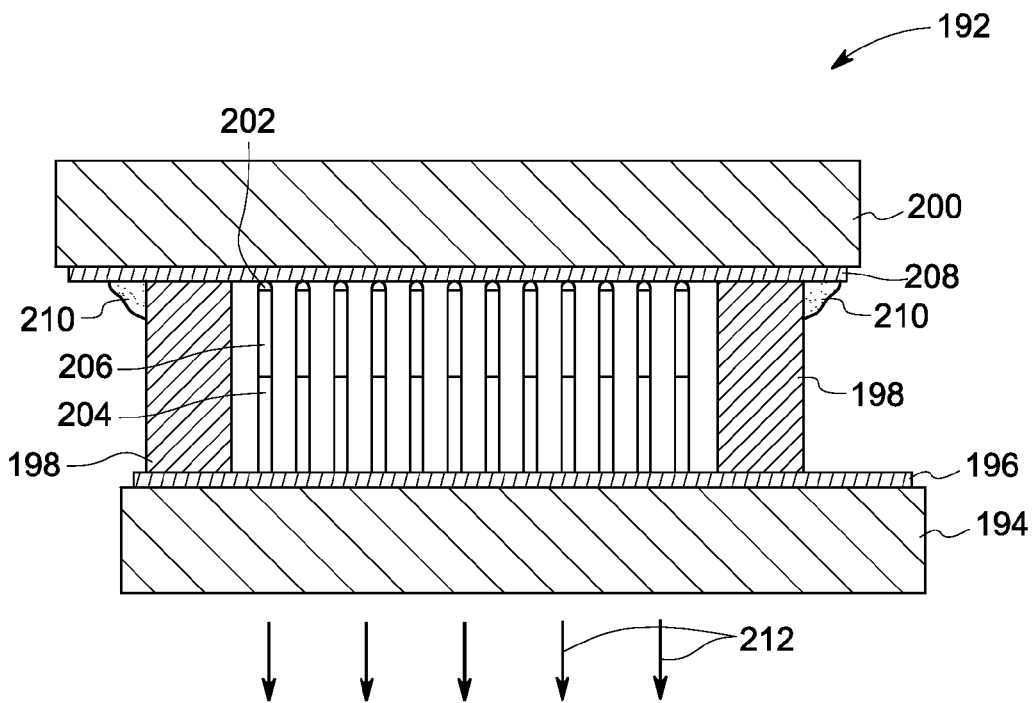
FIG. 17 is a cross-sectional view of an embodiment of a light-emitting nano-wire device.

Referring to FIG. 17, the light-emitting nano-wire device 192, has a electrically conductive element made of a light transmissive substrate 194 coated with a conductive element 196. The conductive element is then plated with an insulation layer (not shown in figure). Then a light resistant layer (not shown in figure) is coated on the surface of the insulation layer. Then an exposure and development zone (not shown in figure) is formed on the light resistant layer and this is removed by etching to form an etching zone (not shown in figure). A part of the insulation layer remains after the formation of the etching zone and this part serves as the insulation layer support post 198 between the electrically conductive element and the cover substrate 200. Then the electrically conductive element is coated with a metal catalyst (aurum, Au) 202 and is heated at about 650 degrees centigrade, so that the metal catalyst may form a nano Au point. Then the light resistant layer is removed and the electrically conductive element coated with the metal catalyst layer is placed in a furnace to grow the nano-wires by the VLS method, to form an N-type semiconductor nano-wire 204 and a P-type semiconductor nano-wire 206 thereby forming a light-emitting nano-wire with a P-N interface. Then, the cover substrate having an inner surface coated with an eutectic alloy layer 208 is disposed on the electrically conductive element having the growing nano-wires, and each of the cover substrate and the electrically conductive element may be pre-provided with connecting terminals. The cover substrate may be heated, so that the eutectic alloy material on the inner face of the cover substrate may be bonded with the metal catalyst on the top of the nano-wires. Then, a bonding glue 210 may be coated on the connection of the cover substrate and the electrically conductive element, which may help prevent water from infiltrating into the elements. Then, the power is turned on, so that the light 212 may be emitted from the surface of the electrically conductive element.

Figure 18:
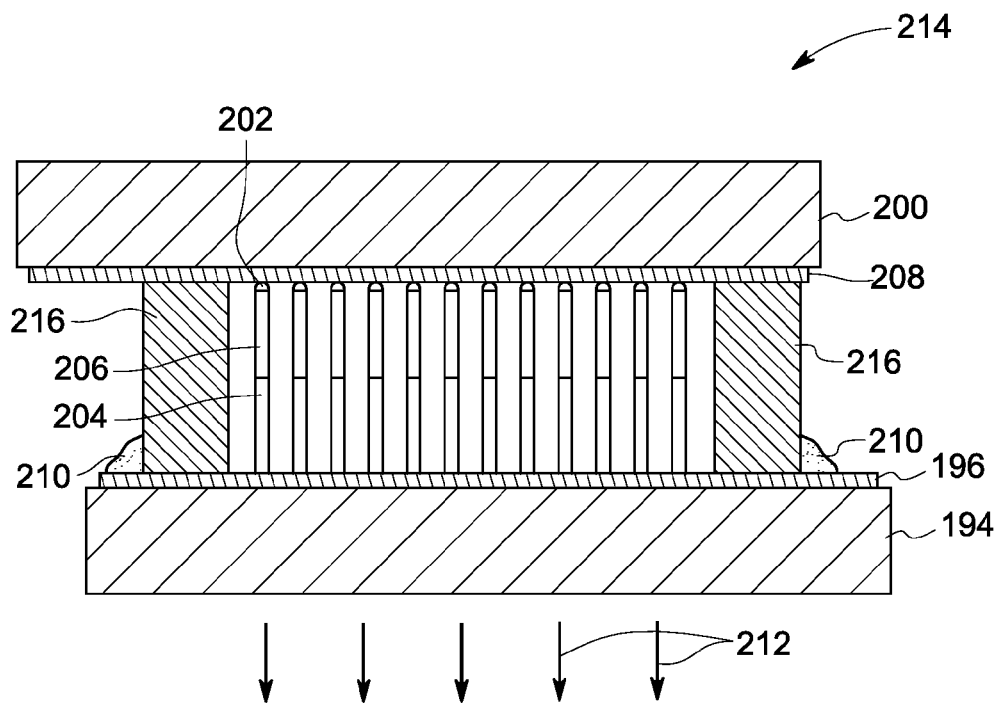
FIG. 18 is a cross-sectional view of an embodiment of a light-emitting nano-wire device.

Referring to FIG. 18, the light-emitting nano-wire device 214, all the elements have the same or similar meaning as described in FIG. 17. The difference is in the material of the insulation layer post, which is replaced with a heat-proof light resistant layer 216. Another difference is that the nano-wire light-emitting diodes and the heat-proof light resistant layer are disposed on the cover substrate. Then, a bonding glue 210 may be coated on the connection of the cover substrate and the electrically conductive element. Then, the power is turned on, so that the light 212 may be emitted from the surface of the electrically conductive element.

Figure 19:
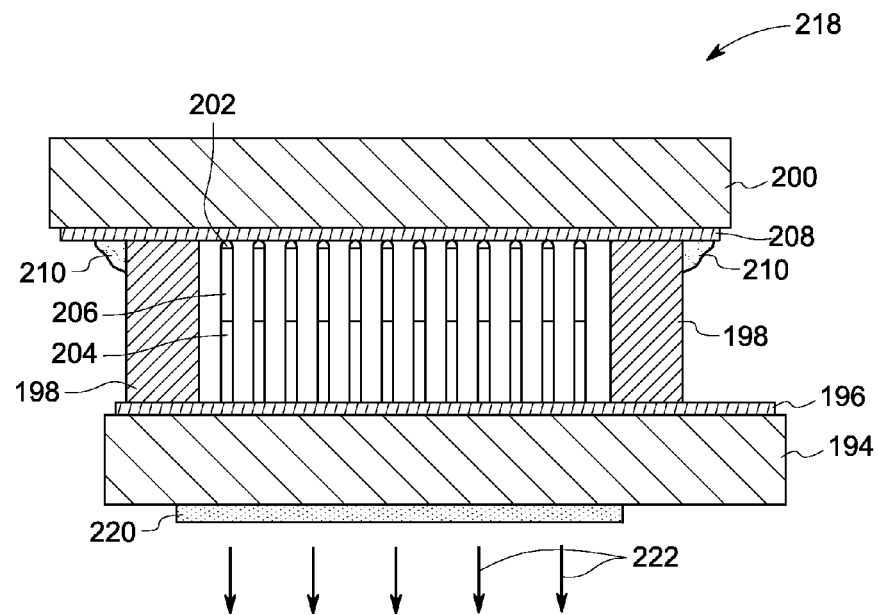
FIG. 19 is a cross-sectional view of an embodiment of a light-emitting nano-wire device.

Referring to FIG. 19, the light-emitting nano-wire device 218 may emit ultra-violet rays, and the light-emitting nano-wire device panel may be coated with fluorescent powder 220 mixed with the red, blue and green colors, thereby emitting a white light 222.

Figure 20:
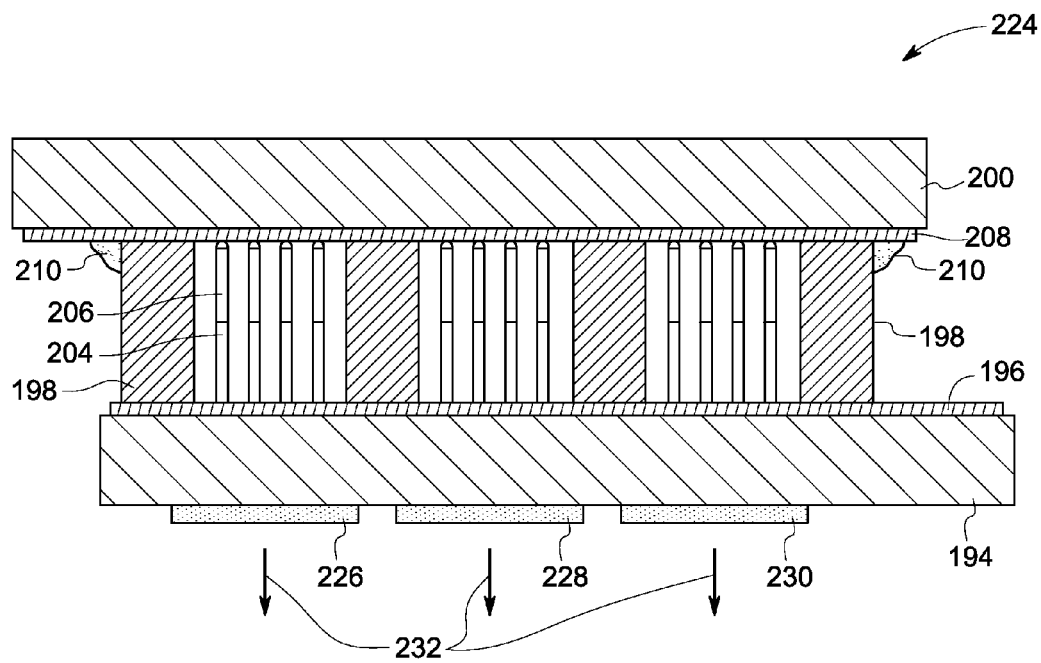
FIG. 20 is a cross-sectional view of an embodiment of a light-emitting nano-wire device.

Referring to FIG. 20, the light-emitting nano-wire device 224 includes multiple (three) light-emitting blocks forming a planar light source. The light-emitting points 226, 228, and 230 of the light-emitting nano-wire device may be coated with red, blue and/or green colors, thereby forming a full color display 232.

In one embodiment, the layer is a first layer of a plurality of layers, and the plurality of layers includes a second layer that includes one or more components capable of emitting light. In one embodiment, the spatial arrangement of the first layer relative to both the second layer and to a viewer is such that the three-dimensional image can be created for view by a viewer. In one embodiment, the light emitted from the first layer has a different wavelength that the light emitted from the second layer. In certain embodiments, the layers are so arranged that the layer that is farthest from the viewer emits light having a wavelength that is more transmissive through a layer that is relatively nearer the viewer, and the layer that is relatively nearer the viewer emits light having a wavelength that is relatively less transmissive than the layer that is further from the viewer.

In one embodiment, the first layer may be in optical communication with a non-OLED light source that can drive light through the stack to the viewer. In one embodiment, the non-OLED light source may be supported on a support substrate that may be opaque. Suitable support substrates may be retroreflective or mirrored.

In one embodiment, the arrangement of controllers from layer to layer is such that the controllers are offset relative to each other so the light does not have to travel through the controller.

In one embodiment, the stack is one of a plurality of similar stacks. In various embodiments, each of the plurality of stacks includes a red OLED, a green OLED, or a blue OLED. In one embodiment, the article may have a pixel density of 10 pixels per square centimeter or 50 pixels per square centimeter, or 100 pixels per square centimeter. In one embodiment, the article may have a voxel density of 100 voxels per cubic centimeter or 500 voxels per cubic centimeter, or 1000 voxels per cubic centimeter.

In one embodiment, is provided an article. The article may include a display structure having a height, a width, and a thickness that define a volume. The display device may include components that emit light to generate a three-dimensional image within the volume. The display structure may include a stack. The stack may include at least one layer. The layer may include a substrate, the components that emit light that are each secured to the substrate, and a controller that is secured to the substrate. The controller may control the components that emit light to generate a three-dimensional image within the volume. The layer may include at least one sub-layer capable of emitting red light, at least one sub-layer capable of emitting blue light, and at least one sub-layer capable of emitting green light, and at least one layer that is capable of reversibly opacifying.

In one embodiment, the sub-layers capable of emitting red, blue or green light may include a plurality of light-emitting elements. Suitable light-emitting elements include organic electronic devices and light-emitting nano-wire devices, that emit light of the desired wavelength i.e., red, blue or green light.

In one embodiment, the article of the invention may include additional layers such as one or more of a barrier layer, an abrasion resistant layer, an adhesion layer, a chemically resistant layer, a photoluminescent layer, a radiation-absorbing layer, a radiation reflective layer, a planarizing layer, an optical diffusing layer, and a light management film.

The barrier layer may include a graded composite barrier coating having an organic component and an inorganic component may be used with a suitable OLED layer. The barrier coating may have greater than 50 percent light transmission of light in the visible wavelength. In one embodiment, the barrier coating light transmission level may be in a range of from about 50 percent to about 60 percent, from about 60 percent to about 70 percent, from about 70 percent to about 80 percent, from about 80 percent to about 90 percent, or greater than about 90 percent transmission of light in the visible wavelength.

A suitable graded composite barrier coating may be the reaction product of reacting plasma species that are deposited onto a substrate surface. Organic coating materials may include carbon, hydrogen, oxygen, and optionally other minor elements, such as sulfur, nitrogen, silicon, etc., depending on the types of reactants. Suitable reactants that result in organic compositions in the coating are straight or branched alkanes, alkenes, alkynes, alcohols, aldehydes, ethers, alkylene oxides, and aromatics having up to about 15 carbon atoms. Suitable inorganic coating materials may include an aluminide, boride, carbide, nitride, oxide, or silicide of an element from Groups IIA, IIIA, IVA, VA, VIA, VIIA, IB, and IIB; metals of Groups IIIB, IVB, and VB of the periodic table of elements. Other suitable inorganic materials may include an aluminide, boride, carbide, nitride, oxide, or silicide of one or more rare-earth metals.

Light management films may be used in the article to help mask physical defects, such as for example, specks, lint, and scratches, and also defects that may be observed due to optical phenomena. The light management films provide control over the direction of light, transmitted and/or reflected. The films may be used to increase brightness or to reduce glare in articles. In one embodiment, the light management film is disposed on an outermost surface of the stack.

Figure 21:
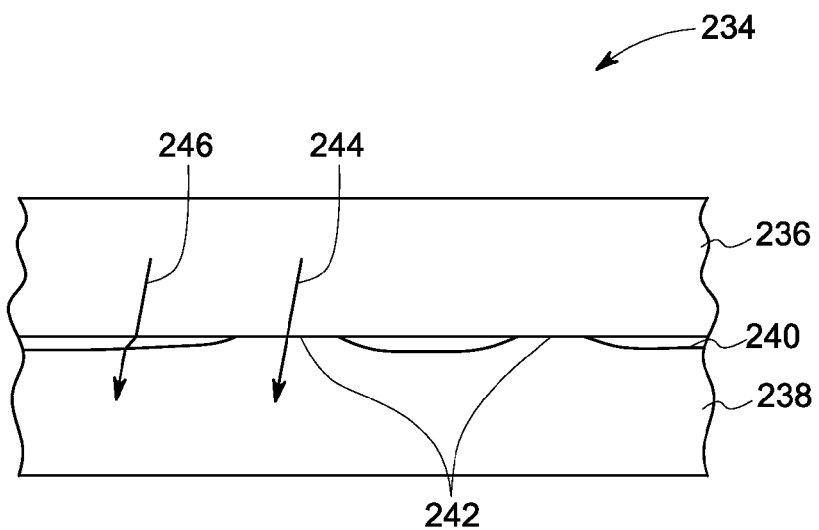
FIGS. 21 and 22 illustrate the problem of wet-out occurring between adjacent films.
Figure 22:
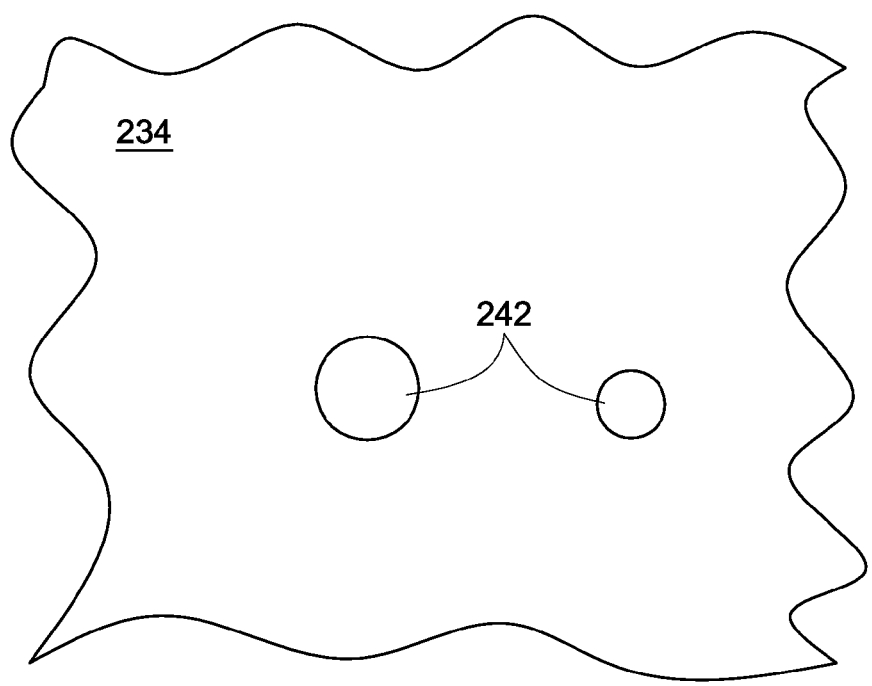

FIGS. 21 and 22 illustrate the formation of wet-out in a multi-layer display device 234. The multi-layer device is shown to have at least a first layer 236 and a second layer 238. The first surface 240 of the second layer is optically contacted at optical contacting points 242 to the first layer. When optical contacting occurs, any light ray 244 that passes through the optical contacting points passes from one layer into the next layer with a reduced refractive effect. Where the refractive indices of the first and the second layers are identical, there is no refractive effect. In contrast, where light passes from the first layer to the second layer where there is no optical contacting points, for example as shown for light ray 246, the light is refracted at each layer-air interface. The viewer detects wet-out regions 242, caused by the optical contacting points. The transmissive properties of the wet-out regions are different from the surrounding area and therefore may be viewed as an abnormality or a defect.

Figure 23:
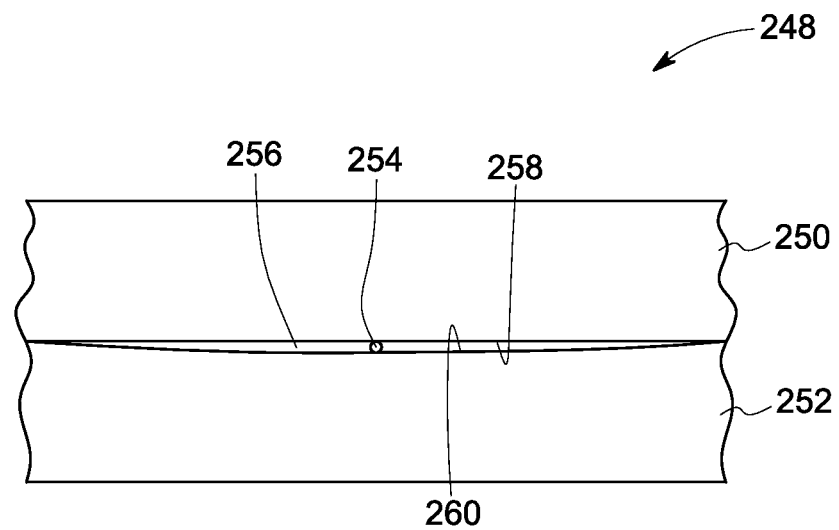
FIGS. 23 and 24 illustrate the problem of Newton's rings formed between adjacent films.
Figure 24:
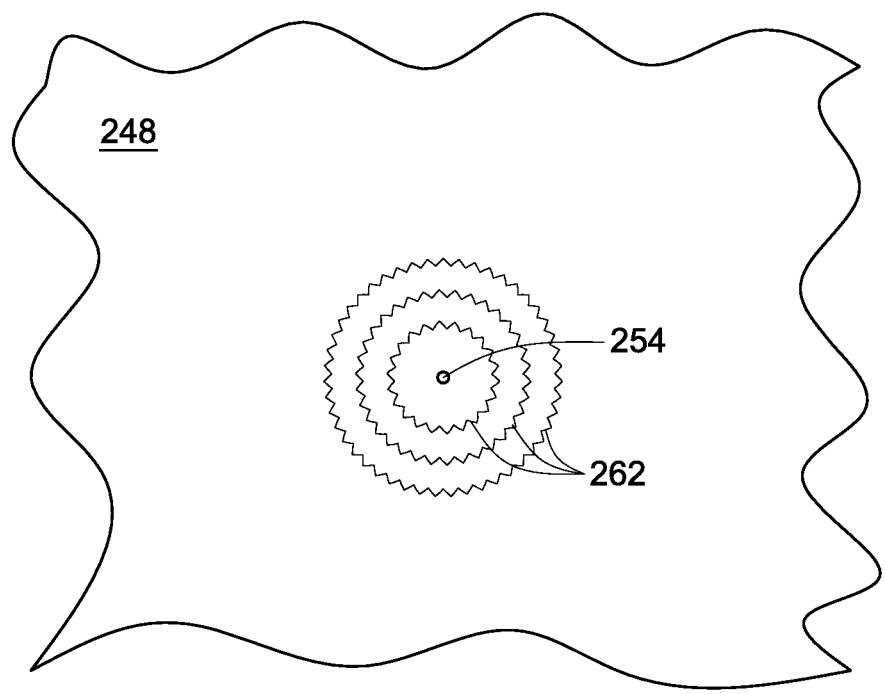

FIGS. 23 and 24 illustrate the formation of Newton's rings, which may be viewed either in transmission or in reflection. Newton's rings may be formed in a multi-layer display device 248, having at least a first layer 250 and a second layer 252. A particle of dust 254 may be trapped between the first and the second layer, resulting in an air gap 256 between respective second and first surfaces 258 and 260 of the first and the second layers. The separation between the second and first surfaces varies with distance from the dust particle. Interference rings are formed by light passing through the multi-layer display device where the air gap is a multiple of half wave lengths of light, as is commonly understood for the formation of Newton's rings 262.

Figure 25:
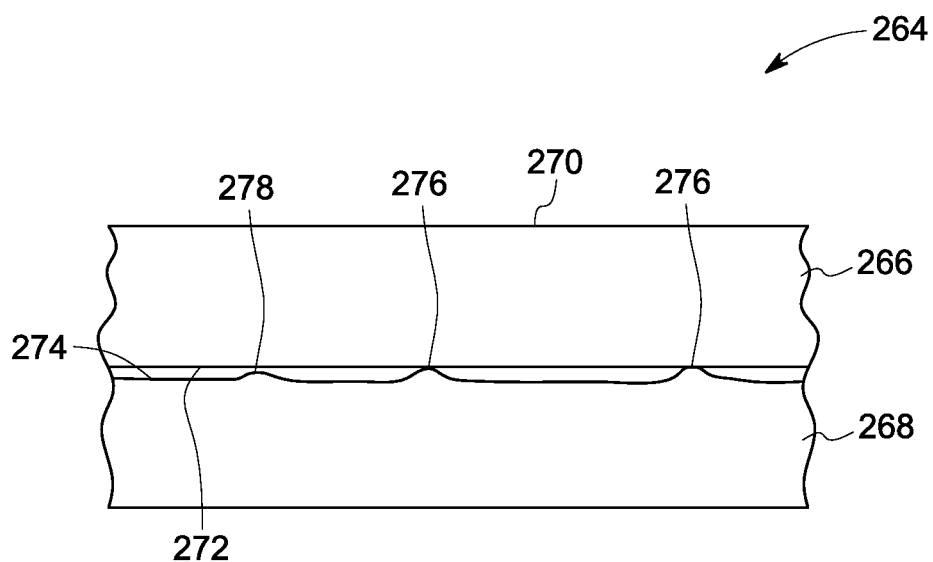
FIGS. 25 and 26 illustrate the anti wet-out effect obtained by using a light management film.
Figure 26:
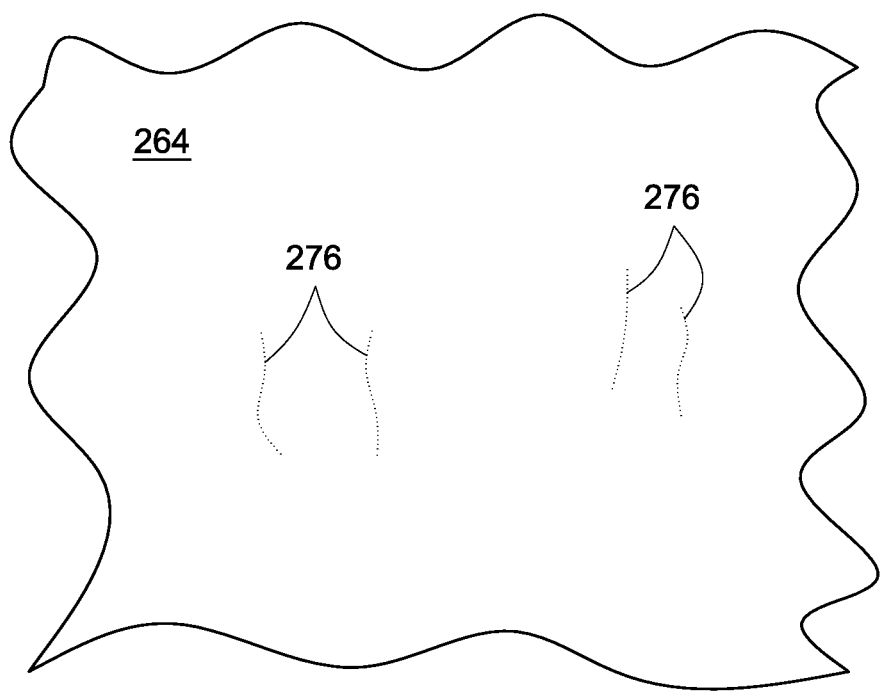
Figure 27:
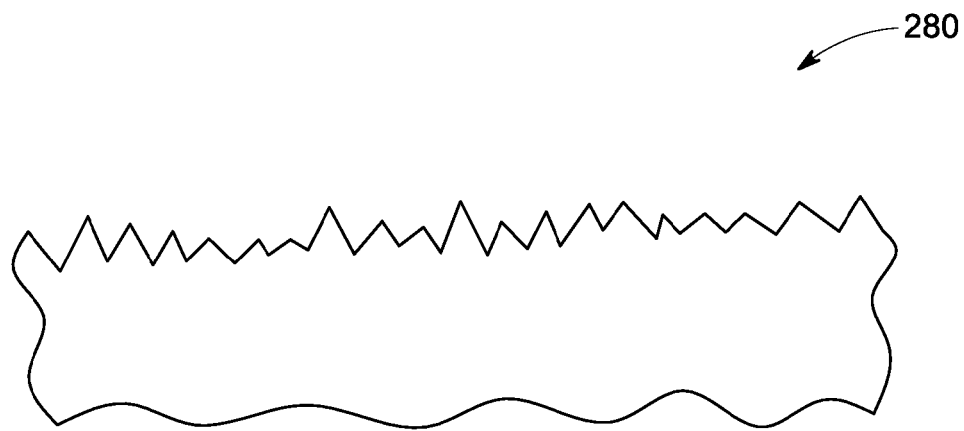
FIGS. 27 to 30 illustrate light management films with different designs that provide surface height randomization.
Figure 28:
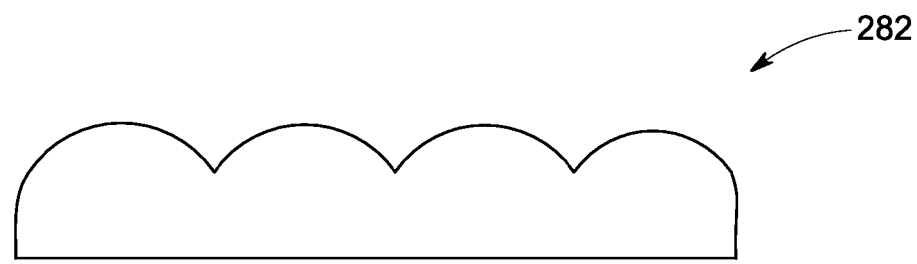
Figure 29:
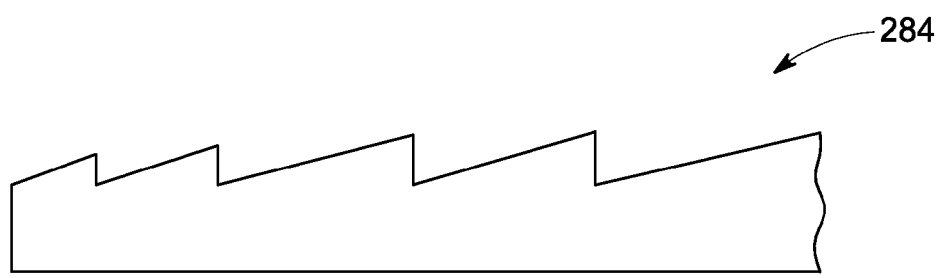
Figure 30:
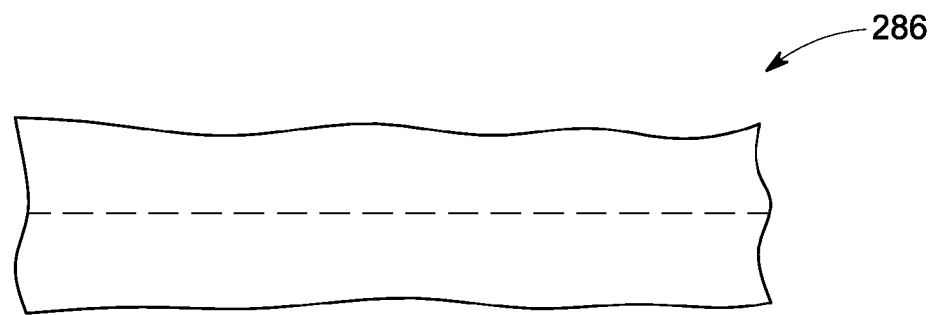

Defects including wet-out and Newton's rings occur when the adjacent surfaces of different layers are smooth and flat. Such defects may be reduced by introducing randomized characteristics or patterns on the layer surface whereby the height of at least one of the film surfaces vary in a random fashion. FIGS. 25 and 26 where a multi-layer display device 264 has a first layer 266 and a second layer 268. The first layer has a first surface 270 and a second surface 272. The second layer has a first surface 274 which has a randomly varying height across the plane of the second layer. The first surface of the second layer has certain local maxima 276 that are sufficiently high as to contact the first layer. There may also be other local maxima 278 that are not sufficiently high to contact the first layer. The random nature of the height minimizes the formation of wet-out regions like those illustrated in FIG. 21. The second layer contacts the first layer only at a number of very small points invisible to the viewer, rather than over a large area as happens with wet-out. When the local maxima of the random height variations are spaced sufficiently close to one another then the appearance of Newton's rings may be reduced. In one embodiment, the light management film may be disposed over the article. In one embodiment, the light management film may be disposed between the different devices in the article or in between the different elements in a device.

Suitable light enhancement films may be flexible or rigid depending on the application. Suitable materials that may be used to prepare the light enhancement films include polymeric materials, such as, for example, acrylics and polycarbonates having nominal indices of refraction of 1.493 and 1.586, respectively. Other useful polymers are polypropylene, polyurethane, polystyrene, polyvinyl chloride, and the like. The particular polymeric material selected is not significant to the invention hereof, so long as it provides the light management function.

The light management films may be suitably designed based on the desired effect. The randomized height variations in light management films may be introduced in the form of prisms/facets formed in any optically useful shape, including lenticular arrays, prisms with rounded peaks and/or valleys, or curved facets, as represented by layers 280 to 286 in FIGS. 27 to 30 respectively. The variations may include the difference in height of the peaks, depth of the valleys, and periodicity of the peaks/valleys, to provide the desired effects. The surface so formed may be referred to as anti wet-out surface. The anti wet-out surface in the films may be produced using a tool manufactured by any known method. For example, if the tool used to produce the film is a roll, it can be manufactured by thread cutting at a constant thread pitch or plunge cutting using a constant spacing between grooves or any other known method.

In one embodiment, the article may further include a reversibly opacifying layer. In one embodiment, the opacifying layer may responds to an electrical signal by switching to or from a light transmissive state from or to a light blocking or light absorbing state. Suitable examples of opacifying layer may include an electrochromic device, suspended particle device, or liquid crystal device.

In one embodiment, the electrochromic device may include a transition metal hydride capable of switching to or from a light transmissive state from or to a light reflective state in response to an applied voltage. In one embodiment, the suspended particle device includes a thin film of rod-like particles suspended in a compliant medium and is capable of switching to and from a random orientation of the particles to an ordered orientation of the particles in response to an applied voltage. In one embodiment, the liquid crystal device includes a thin film of crystals suspended in a compliant medium and is capable of switching to and from a random orientation of the particles to an ordered orientation of the particles in response to an applied voltage.

In one embodiment, the opacifying layer may be disposed between the components that emit light and the substrate. In one embodiment, the opacifying layer may be disposed on a surface of the substrate opposite the components that emit light.

In various embodiments, the opacifying layer may be capable of being controlled so that an opaque plane can be formed behind a portion of the image that is nearest the viewer and in front of another portion of the image that is furthest from the viewer, wherein the viewer may be able to see only a select portion of the image. In one embodiment, the entirety of the image may be rendered in the volume and visible portions of the image can be displayed to the viewer with no ghost effect showing the occluded portions through the image visible portions. In one embodiment, the opaque plane is rendered in real-time and oriented dynamically perpendicular to at least one viewer.

Figure 31:
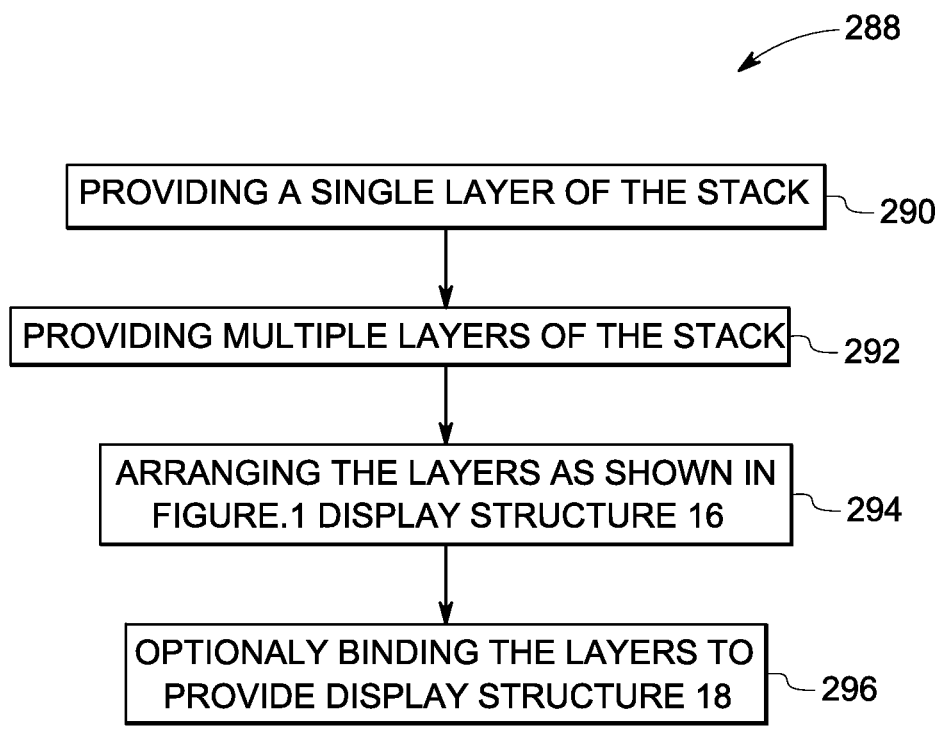
FIG. 31 is a flow chart illustrating a process of fabricating the article according to the invention.

FIG. 31 is a flow chart illustrating an exemplary process 288 of fabricating a device 10. The process begins with the step 290 of providing a single layer of layers 18 of the stack. Referring to FIG. 2, pixel 30 includes a substrate, at least two OLEDs and a controller. Referring to FIG. 3, pixel 52 includes a substrate, a light-emitting nano-wire device and a controller. In one embodiment, the single layer may be manufactured by providing a substrate and disposing a matrix of pixels 30 or 52 on the surface of the substrate. In another embodiment, each pixel 30 or 52 may be individually manufactured and joined together to form a single layer. In one embodiment, the substrate is a glass substrate. In the next step 292 multiple layers are manufactured. In the next step 294 the layers are arranged in a manner as shown in FIG. 1 to provide a display structure having a height 12, width 14 and a thickness 16 that defines a volume. In the next step 296 the layers may be bonded together to provide a display structure 18.

Each pixel includes at least two organic electronic device or at least one nano-wire light-emitting diode and a controller. In the next step 294 the layers 18 may be bonded together to form a three-dimensional display device 20.

Securing or disposing the various layers including the device of the invention may be carried out using known techniques such as spin coating, dip coating, reverse roll coating, wire-wound or MAYER rod coating, direct and offset gravure coating, slot die coating, blade coating, hot melt coating, curtain coating, knife over roll coating, extrusion, air knife coating, spray, rotary screen coating, multilayer slide coating, coextrusion, meniscus coating, comma and microgravure coating, lithographic processes, langmuir processes, and flash evaporation, vapor deposition, plasma-enhanced chemical-vapor deposition "PECVD", radio-frequency plasma-enhanced chemical-vapor deposition "RFPECVD", expanding thermal-plasma chemical-vapor deposition "ETPCVD", electron-cyclotron-resonance plasma-enhanced chemical-vapor deposition ECRPECVD", inductively coupled plasma-enhanced chemical-vapor deposition "ICPECVD", and sputtering techniques including reactive sputtering.

Some devices according to embodiments of the invention may be flexible and transparent.

A method of forming an image is provided in one embodiment of the invention. The method includes controlling organic electronic devices in a volume that are spaced vertically and horizontally relative to a viewer to form a three-dimensional image, and switching on/off light-emitting nano-wires.

A method of forming an image is provided in one embodiment of the invention. The method includes controlling organic electronic devices that are in a volume and that are spaced vertically and horizontally relative to a viewer to form a three-dimensional image, and switching on/off the organic electronic devices using transparent controllers. Each of the controllers may be attached to a plurality of light-emitting devices. In one embodiment, the method may further include controlling red/green/blue sub-stacks to define two or more point light sources horizontally adjacent but vertically spaced so that the appearance is a continuous line that is angled away from the viewer. In one embodiment, the method may further include sending relatively more power to the light components buried in the stack to give an appearance to the viewer that they are of the same intensity as the light components on outer portion of the stack.

A method of forming an image is provided in one embodiment of the invention. The method includes forming in a volume a complete three-dimensional image observable by a viewer and forming an opaque layer that transects the image. In one embodiment, the opaque layer is dynamic and positionable responsive to movement by at least one of the viewer or of the image. In one embodiment, the opaque layer blocks or obscures line of sight from the viewer to a furthermost portion of the image relative to the viewer. In one embodiment, the opaque layer is on a plane that is about perpendicular to the viewer. In one embodiment, the opaque layer formed is conformal to an inner surface that is distal from the viewer of a portion the image that is proximate to the viewer, whereby a furthermost portion of the image is displayed but not visible to the viewer.

EXAMPLES

The following examples are intended only to illustrate methods and embodiments in accordance with the invention, and as such should not be construed as imposing limitations upon the clauses. Unless specified otherwise, all ingredients are commercially available from such common chemical suppliers as Alpha Aesar, Inc. (Ward Hill, Mass.), Spectrum Chemical Mfg. Corp. (Gardena, Calif.), and the like.

Example 1

EL Material Synthesis

A sample of poly ((N,N-ethylmethyl aminomethyl) styrene) (PS-Amine) is synthesized as follows: A solution of an isomeric mixture of poly(3-chloromethyl)styrene and poly (4-chloromethylstyrene) (2 grams, 13.2 millimoles) and N-ethylmethylamine (CAS No. 624-78-2, 11.8 grams, 200 millimoles) in 25 milliliters of toluene is stirred at room temperature for 5 days. The reaction mixture is a slurry containing precipitated solids. The reaction mixture is transferred to a separatory funnel and diluted with toluene. The organic phase is washed twice with 1 weight percent aqueous NaOH solution, twice with water, and the solvent is removed under vacuum. The tacky, white solid residue is dissolved in methanol and precipitated into water in a blender. The collected solid is air-dried, and then dried in a vacuum oven at 50 degrees Celsius to afford the reaction product of poly (N,N-ethylmethyl aminomethyl) styrene.

Example 2

A Transparent Organic Light-Emitting Device Fabrication

Step 1: Preparation of a Green-Color Organic Light-Emitting Device (Green OLED).

A glass substrate is coated with a layer of indium tin oxide, which is commercially available from Applied Films, Inc. (City, State). The coated substrate is exposed to ultraviolet radiation. A layer (ca. 60 nanometers) of poly(3,4-ethylendioxythiophene/polystyrene sulfonate (PEDOT:PSS) (BAYTRON® commercially available from Bayer Corporation (City, State), is deposited onto the indium tin oxide coated substrates via spin-coating to form an intermediate. The intermediate is baked for 1 hour at 180 degrees Celsius in air to form a PEDOT layer. A layer (ca. 70 nanometers) of a green light-emitting polymer (LEP) (LUMATION® 1304 commercially available from Dow Chemical (City, State) is then spin-coated atop the PEDOT layer to form a green LEP layer. The samples are transferred to an argon filled glovebox nominally containing less than 1 parts per million of oxygen and moisture.

A solution of PS-amine in 1-butanol is spin-coated atop the green LEP layer to form a PS-amine layer (ca. about 5 nanometers to 8 nanometers). The PS amine layer is baked for 30 minutes at 90 degrees Celsius in air. Another ITO layer (ca. 110 nanometers) is sputtered onto the PS-amine layer surface using a CVC601 sputter tool at a base pressure of $1 \times 10-6$ torr to provide a green OLED. The ITO DC magnetron sputtering is carried out at a pressure of 0.7 millimeter Torr, with 30 standard cubic centimeter of argon and 8.5 standard cubic centimeter of oxygen under a sputter power density of 18.3 watts per square inch.

The samples are electrically grounded, unheated, and placed 1 inch away from sputter target. To achieve uniform ITO coatings, the substrates are kept constantly rotating at 4 seconds per cycle throughout the deposition process. The ITO layer is deposited in 11 minutes, corresponding to a deposition rate of ca. 1.7 Angstrom per second. The ITO coatings so deposited exhibit a sheet resistance of about 45 Ohm per square centimeter.

Optical transmittance is measured with an USB2000 Miniature Fiber Optic Spectrometer commercially available from Ocean Optics (Dunedin, Fla. 34698, USA). The device performance is characterized by measuring current-voltage-luminance (I-V-L) characteristics and electroluminescence spectra. A photodiode calibrated with a luminance meter (MINOLTA LS-110) was used to measure the luminance (in units of candela per square meter, cd/m 2). A plot of efficiency (measured in candela per ampere, cd/A) as a function of current density (measured in milliamperes per square centimeter, mA/cm 2) is obtained for each device from its I-V-L data.

Step 2: Preparation of a ZnO-Based TFT.

A ZnO-based TFT is fabricated using a bottom gate configuration. A borosilicate glass substrate is coated with 200 nanometers thick ITO film and a 220 nanometers thick atomic layer deposition (ATO) film, obtained from Planar Systems (City, State). The ITO layer on the substrate has an average transmittance of 85 percent, a resistivity of $2.3 \times 10-4$ Ohm centimeter, a carrier concentration of $7.7 \times 1020$ centimeter-3, and a mobility of 36 centimeter 2/Volt-seconds 6, serves as the gate electrode. The ATO film composed of a superlattice of alternating layers of Al2O3 and TiO2, serves as the gate insulator. The ATO has a measured capacitance of about 60 nanoFaradays/centimeter 2 with a dielectric constant of about 16e0. First, a ZnO film 100 nanometers thick is deposited by sputtering on the precoated borosilicate glass using a RF (13.56 MHz) magnetron system. Next, the drain electrode and source electrode, both 300 nanometers thick ITO layers, are patterned on the borosilicate glass using the etching technique.

The resultant thin film bottom-gate type ZnO TFT shows good device performance of about 1 square centimeter/volts-.second, on-off ratio of greater than 105, and a gate voltage swing of 4 volt/decade. The TFT shows a transparency of about 80 percent at a wavelength of 550 nanometers of visible light.

Step 3: Preparation of a Light-Emitting Device

A layer of glass 500 nanometers thick and having a percentage transparency of 90 at a wavelength of 550 nanometers is the light transmissive layer. The green-OLED prepared in step 1 and the ZnO-based TFT prepared in step 2 are both secured to the glass to form a first layer device. A second layer of glass is disposed over the first layer of the device. A second green-OLED secures to the second glass layer. The active emitting-areas of the two OLEDs overlap. The TFT is operably coupled with both the green-OLEDs. The assembly is aligned such that the color emitted consists of the light emitted by both the OLEDs based on the on-off condition of the TFT controller. The edges of the assembly are sealed with the NORLAND ADHESIVE to provide mechanical integrity.

The embodiments described herein are examples of compositions, structures, systems and methods having elements corresponding to the elements of the invention recited in the claims. This written description may enable those of ordinary skill in the art to make and use embodiments having alternative elements that likewise correspond to the elements of the invention recited in the claims. The scope of the invention thus includes compositions, structures, systems and methods that do not differ from the literal language of the claims, and further includes other structures, systems and methods with insubstantial differences from the literal language of the claims. While only certain features and embodiments have been illustrated and described herein, many modifications and changes may occur to one of ordinary skill in the relevant art. The appended claims cover all such modifications and changes.

The invention claimed is:

1. An article, comprising:
    a display structure having a height, a width, and a thickness that define a volume, and the display structure can include components that emit light to generate a three-dimensional image within the volume, the display structure comprising a stack, wherein the stack comprises at least one layer:
    the layer comprising: a substrate; the components that emit light that are each secured to the substrate; and a controller that is secured to the substrate;
    wherein the controller can control the components that emit light to generate a three-dimensional image within the volume, and at least one of the following:
    the components that emit light are organic electronic devices, and the controller is connected to two or more of the organic electronic devices, or
    the components that emit light comprise a light-emitting nano-wire device, wherein the layer further comprises a reversibly opacifying layer.

2. The article as defined in claim 1, wherein the components that emit light are organic electronic light-emitting devices and the organic electronic devices are each secured to a surface of the substrate.

3. The article as defined in claim 1, wherein the components that emit light comprise nano-wire light-emitting devices and the nano-wire light emitting devices are each secured to a surface of the substrate.

4. The article as defined in claim 1, wherein the substrate is light transmissive, the organic electronic device is light transmissive, the controller is light transmissive, and the light-emitting nano-wire device is light transmissive.

5. The article as defined in claim 1, wherein the layer is a first layer of a plurality of layers, and the plurality of layers comprises a second layer that includes one or more components capable of emitting light.

6. The article as defined in claim 5, wherein the spatial arrangement of the first layer relative to both the second layer and to a viewer is such that the three-dimensional image can be created for view by a viewer.

7. The article as defined in claim 6, wherein the light emitted from the first layer has a different wavelength than the light emitted from the second layer.

8. The article as defined in claim 6, wherein the layers are so arranged that the layer that is farthest from the viewer emits light having a wavelength that is more transmissive through a layer that is relatively nearer the viewer, and the layer that is relatively nearer the viewer emits light having a wavelength that is relatively less transmissive than the layer that is further from the viewer.

9. The article as defined in claim 6, wherein the first layer is in optical communication with a non-OLED light source that can drive light through the stack to the viewer.

10. The article as defined in claim 9, wherein the non-OLED light source is supported on a support substrate that is opaque.

11. The article as defined in claim 10, wherein the support substrate is retroreflective or mirrored.

12. The article as defined in claim 1, wherein the arrangement of controllers from layer to layer is such that the controllers are offset relative to each other so the light does not have to travel through the controller.

13. The article as defined in claim 1, wherein the components that emit light are organic electronic light-emitting devices, and the controller is connected to two or more of the organic electronic light-emitting devices.

14. The article as defined in claim 1, wherein the layer comprises at least one sub-layer capable of emitting red light, at least one sub-layer capable of emitting blue light, and at least one sub-layer capable of emitting green light, and at least one layer that is capable of reversibly opacifying.

15. The article as defined in claim 1, further comprising at least one of a barrier layer, an abrasion resistant layer, an adhesion layer, a chemically resistant layer, a photoluminescent layer, a radiation-absorbing layer, a radiation reflective layer, a planarizing layer, an optical diffusing layer, or a light management film.

16. The article as defined in claim 15, wherein the light management film is disposed on an outermost surface of the stack.

17. The article as defined in claim 1, wherein the article has a pixel density of greater than 100 pixels per square centimeter.

18. The article as defined in claim 1, wherein the article has a voxel density of 1000 voxels per cubic centimeter.

19. The article as defined in claim 1, wherein the opacifying layer responds to an electrical signal by switching to or from a light transmissive state from or to a light blocking or light absorbing state.

20. The article as defined in claim 1, wherein the opacifying layer comprises an electrochromic device, suspended particle device, or liquid crystal device.

21. The article as defined in claim 20, wherein the electrochromic device comprises a transition metal hydride capable of switching to or from a light transmissive state from or to a light reflective state in response to an applied voltage.

22. The article as defined in claim 20, wherein the suspended particle device comprises a thin film of rod-like particles suspended in a compliant medium and is capable of switching to and from a random orientation of the particles to an ordered orientation of the particles in response to an applied voltage.

23. The article as defined in claim 20, wherein the liquid crystal device comprises a thin film of crystals suspended in a compliant medium and is capable of switching to and from a random orientation of the particles to an ordered orientation of the particles in response to an applied voltage.

24. The article as defined in claim 1, wherein the opacifying layer is disposed between the components that emit light and the substrate.

25. The article as defined in claim 1, wherein the opacifying layer is disposed on a surface of the substrate opposite the components that emit light.

26. The article as defined in claim 1, wherein the opacifying layer is capable of being controlled so that an opaque plane can be formed behind a portion of the image that is nearest the viewer and in front of another portion of the image that is furthest from the viewer, wherein the viewer is able to see only a select portion of the image.

27. The article as defined in claim 26, wherein the entirety of the image can be rendered in the volume and visible portions of the image can be displayed to the viewer with no ghost effect showing the occluded portions through the image visible portions.

28. The article as defined in claim 26, wherein the opaque plane is rendered in real-time and oriented dynamically perpendicular to at least one viewer.

29. An article, comprising:
a display structure having a height, a width, and a thickness that define a volume, and the display device can include components that emit light to generate a three-dimensional image within the volume, the display structure comprising a stack, wherein the stack comprises at least one layer:
the layer comprising: a substrate; the components that emit light that are each secured to the substrate; and a controller that is secured to the substrate and can control the components that emit light to generate a three-dimensional image within the volume, and
the layer comprises at least one sub-layer capable of emitting red light, at least one sub-layer capable of emitting blue light, and at least one sub-layer capable of emitting green light, and at least one layer that is capable of reversibly opacifying.

30. An article, comprising:
a display structure having a height, a width, and a thickness that define a volume, and the display structure can include components that emit light to generate a three-dimensional image within the volume, the display structure comprising a stack, wherein the stack comprises at least one layer:
the layer comprising: a substrate; the components that emit light that are each secured to the substrate; and a controller that is secured to the substrate;

wherein the controller can control the components that emit light to generate a three-dimensional image within the volume, and at least one of the following:

the components that emit light are organic electronic devices, and the controller is connected to two or more of the organic electronic devices, or the components that emit light comprise a light-emitting nano-wire device;

further wherein the substrate is light transmissive, the organic electronic device is light transmissive, the controller is light transmissive, and the light-emitting nano-wire device is light transmissive.

31. An article, comprising:

a display structure having a height, a width, and a thickness that define a volume, and the display structure can include components that emit light to generate a three-dimensional image within the volume, the display structure comprising a stack, wherein the stack comprises at least one layer:

the layer comprising: a substrate; the components that emit light that are each secured to the substrate; and a controller that is secured to the substrate;

wherein the controller can control the components that emit light to generate a three-dimensional image within the volume, and at least one of the following:

the components that emit light are organic electronic devices, and the controller is connected to two or more of the organic electronic devices, or the components that emit light comprise a light-emitting nano-wire device;

wherein the layer is a first layer of a plurality of layers, and the plurality of layers comprises a second layer that includes one or more components capable of emitting light;

wherein the spatial arrangement of the first layer relative to both the second layer and to a viewer is such that the three-dimensional image can be created for view by a viewer;

wherein the layers are so arranged that the layer that is farthest from the viewer emits light having a wavelength that is more transmissive through a layer that is relatively nearer the viewer, and the layer that is relatively nearer the viewer emits light having a wavelength that is relatively less transmissive than the layer that is further from the viewer.

32. An article, comprising:

a display structure having a height, a width, and a thickness that define a volume, and the display structure can include components that emit light to generate a three-dimensional image within the volume, the display structure comprising a stack, wherein the stack comprises at least one layer:

the layer comprising: a substrate; the components that emit light that are each secured to the substrate; and a controller that is secured to the substrate;

wherein the controller can control the components that emit light to generate a three-dimensional image within the volume, and at least one of the following:

the components that emit light are organic electronic devices, and the controller is connected to two or more of the organic electronic devices, or the components that emit light comprise a light-emitting nano-wire device;

wherein the arrangement of controllers from layer to layer is such that the controllers are offset relative to each other so the light does not have to travel through the controller.

33. An article, comprising:

a display structure having a height, a width, and a thickness that define a volume, and the display structure can include components that emit light to generate a three-dimensional image within the volume, the display structure comprising a stack, wherein the stack comprises at least one layer:

the layer comprising: a substrate; the components that emit light that are each secured to the substrate; and a controller that is secured to the substrate;

wherein the controller can control the components that emit light to generate a three-dimensional image within the volume, and at least one of the following:

the components that emit light are organic electronic devices, and the controller is connected to two or more of the organic electronic devices, or the components that emit light comprise a light-emitting nano-wire device;

wherein the layer comprises at least one sub-layer capable of emitting red light, at least one sub-layer capable of emitting blue light, and at least one sub-layer capable of emitting green light, and at least one layer that is capable of reversibly opacifying.

* * * * *

UNITED STATES PATENT AND TRADEMARK OFFICE
CERTIFICATE OF CORRECTION

PATENT NO.       : 8,525,954 B2
APPLICATION NO.  : 11/768937
DATED            : September 3, 2013
INVENTOR(S)      : Li et al.

It is certified that error appears in the above-identified patent and that said Letters Patent is hereby corrected as shown below:

Title Page, Item (73), under "Assignee", in Column 1, Line 1,
delete "Niskyuna," and insert -- Niskayuna, --, therefor.

Title Page 2, Item (56), under "OTHER PUBLICATIONS", in Column 2,
Line 7, delete "2005, GE Docket No. 166471-1." and insert -- 2005. --, therefor.

Title Page 2, Item (56), under "OTHER PUBLICATIONS", in Column 2,
Line 10, delete "2005, GE Docket No. 166471-2." and insert -- 2005. --, therefor.

In the Drawings

In Fig. 31, Sheet 18 of 18, for Tag "294", in Line 2, delete "FIGURE. 1" and insert -- FIGURE 1 --, therefor.

In Fig. 31, Sheet 18 of 18, for Tag "296", in Line 1, delete "OPTIONALY" and insert -- OPTIONALLY --, therefor.

In the Specification

In Column 12, Line 32, delete "Ga2O3," and insert -- $Ga_2O_3$, --, therefor.

In Column 14, Line 46, delete "bias 60" and insert -- bias 60. --, therefor.

In Column 15, Line 23, delete "substreate" and insert -- substrate --, therefor.

In Column 15, Line 30, delete "device." and insert -- device --, therefor.

In Column 23, Line 29, delete "1×10-6" and insert -- $1\times10^{-6}$ --, therefor.

Signed and Sealed this
Fifth Day of November, 2013

Teresa Stanek Rea
*Deputy Director of the United States Patent and Trademark Office*

CERTIFICATE OF CORRECTION (continued)
U.S. Pat. No. 8,525,954 B2

In Column 23, Line 50, delete "cd/m 2)." and insert -- $cd/m^2$). --, therefor.

In Column 23, Line 53, delete "mA/cm 2)" and insert -- $mA/cm^2$) --, therefor.

In Column 23, Line 61, delete "10-4" and insert -- $10^{-4}$ --, therefor.

In Column 23, Line 62, delete "centimeter -3," and insert -- $centimeter^{-3}$, --, therefor.

In Column 23, Line 63, delete "36 centimeter 2/Volt-seconds 6," and insert -- 36 $centimeter^2$/Volt-$seconds^6$, --, therefor.

In Column 23, Line 67, delete "centimeter 2" and insert -- $centimeter^2$ --, therefor.